(12) United States Patent
Yahata et al.

(10) Patent No.: US 8,228,700 B2
(45) Date of Patent: Jul. 24, 2012

(54) POWER CONVERSION DEVICE

(75) Inventors: Koichi Yahata, Hitachinaka (JP);
Masashige Tsuji, Hitachinaka (JP);
Yoshio Akaishi, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 12/867,866

(22) PCT Filed: Jul. 30, 2009

(86) PCT No.: PCT/JP2009/063596
§ 371 (c)(1),
(2), (4) Date: Oct. 27, 2010

(87) PCT Pub. No.: WO2010/038541
PCT Pub. Date: Apr. 8, 2010

(65) Prior Publication Data
US 2011/0199800 A1    Aug. 18, 2011

(30) Foreign Application Priority Data
Sep. 30, 2008  (JP) ................................ 2008-253660

(51) Int. Cl.
*H02M 7/5387*  (2007.01)
*H02M 1/00*  (2007.01)
*H05K 7/20*  (2006.01)
*H02B 1/00*  (2006.01)

(52) U.S. Cl. ........ 363/144; 363/132; 363/141; 361/601; 361/679.01

(58) Field of Classification Search ................... 363/132, 363/141, 144; 361/601, 622, 679.01, 736
See application file for complete search history.

(56) References Cited

U.S. PATENT DOCUMENTS

| | | | | |
|---|---|---|---|---|
| 5,579,217 A | * | 11/1996 | Deam et al. | 363/144 |
| 6,175,084 B1 | | 1/2001 | Saitoh et al. | |
| 6,369,332 B1 | | 4/2002 | Saitoh et al. | |
| 7,301,755 B2 | * | 11/2007 | Rodriguez et al. | 361/676 |
| 7,751,194 B2 | * | 7/2010 | Sakamoto et al. | 361/719 |
| 2009/0027936 A1 | * | 1/2009 | Glueck et al. | 363/132 |

FOREIGN PATENT DOCUMENTS

| | | |
|---|---|---|
| JP | 9-139580 A | 5/1997 |
| JP | 2002-76236 A | 3/2002 |
| JP | 2007-336793 A | 12/2007 |
| JP | 2008-118815 A | 5/2008 |

OTHER PUBLICATIONS

International Search Report dated Nov. 2, 2009 including English-language translation (Two (2) pages).

* cited by examiner

*Primary Examiner* — Gary L Laxton
*Assistant Examiner* — Zekre Tsehaye
(74) *Attorney, Agent, or Firm* — Crowell & Moring LLP

(57) ABSTRACT

Connection portions (225UP through 225WP) to which upper arm control terminals (320UU through 320UW) are connected are disposed at a first edge portion of a drive circuit board (22). And connection portions (225UN through 225WN) to which lower arm control terminals (320LU through 320LW) are connected are disposed at a second edge portion of the drive circuit board (22). Upper arm implementation regions (227UP through 227WP), lower arm implementation regions (227UN through 227WN), and a low voltage pattern region (228) in which photo-couplers (221U through 221W) are implemented are formed in the board region between these board edge portions. And signal wiring (40U) that transmits a control signal from a photo-coupler (221U) to an implementation region (227UN) is formed in a conductor layer that is a lower layer than the conductor layer in the lower arm implementation region in which the lower arm driver circuit is implemented.

7 Claims, 17 Drawing Sheets

POWER CONVERSION DEVICE

TECHNICAL FIELD

The present invention relates to a power conversion device that performs conversion between DC power and AC power.

BACKGROUND ART

In the case of, for example, a power conversion device for a vehicle, an inverter circuit that consists of semiconductor chips for power and a heat dissipation substrate and so on is modularized. In order to keep the wiring between the semiconductor module and a driver circuit board for driving the inverter circuit to the minimum limit, the driver circuit board is mounted in proximity to the semiconductor module, and is electrically connected to the control terminals of the semiconductor module by fixing with solder or the like.

Generally, if the battery voltage is a high voltage such as 42V or greater, in the interests of safety, a controller and the driver circuit are separated by signal transmission elements such as photo-couplers or the like. Furthermore, in order to ensure insulation between the positive electrode side input and the negative electrode side input, it is necessary to guarantee that the distances between the upper and lower arms are larger than a certain value, so as to ensure insulation between them.

Moreover, since the voltage of an upper arm driver circuit portion that is connected to an upper arm power semiconductor changes from plus to minus each time the upper arm power semiconductor is switched, accordingly it is necessary to ensure good insulation between locations that are at the potential of the positive electrode and locations that are at the potential of the negative electrode. Furthermore, if it is necessary to supply a high current for driving a motor, it is necessary to ensure that the insulation is proof against fluctuations of electrical potential, because the potentials between the various phases of the lower arm driver circuit portions that are connected to the lower arm power semiconductors fluctuate along with change of the current.

As described above, the driver circuit board has circuit portions at different potentials, i.e. some portions that are connected to the controller and are at low potential, some portions that are connected to the battery and are at positive potential or negative potential, and some portions that are at output terminal potential so that they change between positive and negative potential each time switching occurs; and so, in each case, it is necessary to maintain a certain necessary distance between the various portions, and to ensure insulation between them.

For example, with the technique described in Patent Document #1, it is proposed to mount photo-couplers for signal insulation on an external portion around the driver circuit board, etc., and thereby it is anticipated that the driver circuit board can be made more compact while still ensuring insulation between the various components.

Patent Document #1: Japanese Laid-Open Patent Publication 2007-336793

SUMMARY OF THE INVENTION

Problems to be Solved by the Invention

However, if the control terminals for the semiconductor module are located upon an external portion around the module, then, in order to ensure good insulation between the signal lines to the photo-couplers and the control terminals of the semiconductor module that are at high potential, it is necessary to mount the photo-couplers while ensuring that they are kept at certain distances from the control terminals. Due to this, it is necessary to make the driver circuit board larger than the semiconductor module, and this causes the problem that it invites increase in size of the power conversion device as a whole.

Means for Solving the Problems

According to the 1st aspect of the present invention, a power conversion device comprises: a power module comprising an inverter circuit that comprises, for each phase, an upper arm switching element and a lower arm switching element; and a drive circuit board upon which are implemented, for each phase, an upper arm driver circuit that outputs a drive signal to the upper arm switching element and a lower arm driver circuit that outputs a drive signal to the lower arm switching element; wherein: the drive circuit board is made as a laminated board in which a plurality of conductor layers and a plurality of insulating layers are alternately laminated together, and comprises a first board edge portion to which control terminals for the upper arm switching elements are connected, a second board edge portion to which control terminals for the lower arm switching elements are connected, and a board region located between the first and second board edge portions; in the board region, along with an upper arm implementation region upon which the upper arm driver circuits are implemented and a lower arm implementation region upon which the lower arm driver circuits are implemented being formed for each phase, a low voltage system region is formed upon which are implemented signal transmission elements that transmit control signals to each of the driver circuits while electrically insulating the control signals; and signal wiring that transmits control signals from the signal transmission elements to the corresponding driver circuits is formed so as to pass under the lower arm driver circuits in a lower conductor layer than the conductor layer at which the lower arm driver circuits are implemented.

According to the 2nd aspect of the present invention, a power conversion device, comprises: a power module comprising an inverter circuit that comprises, for each phase, an upper arm switching element and a lower arm switching element; and a drive circuit board upon which are implemented, for each phase, an upper arm driver circuit that outputs a drive signal to the upper arm switching element and a lower arm driver circuit that outputs a drive signal to the lower arm switching element; wherein: the drive circuit board is made as a laminated board in which a plurality of conductor layers and a plurality of insulating layers are alternately laminated together, and comprises a first board edge portion to which control terminals for the upper arm switching elements are connected, a second board edge portion to which control terminals for the lower arm switching elements are connected, and a board region located between the first and second board edge portions; in the board region, along with an upper arm implementation region upon which the upper arm driver circuits are implemented and a lower arm implementation region upon which the lower arm driver circuits are implemented being formed for each phase, a low voltage system region is formed upon which are implemented signal transmission elements that transmit control signals to each of the driver circuits while electrically insulating the control signals; and a power supply circuit transformer that supplies source voltage to the upper arm driver circuits and the lower arm driver circuits is implemented in the board region, so as to overlap at least part of at least one of the upper arm implementation region and the lower arm implementation region.

It should be noted that the power conversion device may further comprise half bridge type pre-driver elements that are connected to the upper arm driver circuits and the lower arm driver circuits, and that comprise level shift circuits that convert control signals inputted to the lower arm driver circuits to upper arm signals.

According to the 3rd aspect of the present invention, a power conversion device comprises: a power module comprising an inverter circuit that comprises, for each phase, an upper arm switching element and a lower arm switching element; a drive circuit board upon which are implemented, for each phase, an upper arm driver circuit that outputs a drive signal to the upper arm switching element and a lower arm driver circuit that outputs a drive signal to the lower arm switching element; and half bridge type pre-driver elements that are connected to the upper arm driver circuits and the lower arm driver circuits, and that comprise level shift circuits that convert control signals inputted to the lower arm driver circuits to upper arm signals; wherein: the drive circuit board is made as a laminated board in which a plurality of conductor layers and a plurality of insulating layers are alternately laminated together, and comprises a first board edge portion to which control terminals for the upper arm switching elements are connected, a second board edge portion to which control terminals for the lower arm switching elements are connected, and a board region located between the first and second board edge portions; in the board region, along with an upper arm implementation region upon which the upper arm driver circuits are implemented and a lower arm implementation region upon which the lower arm driver circuits are implemented being formed for each phase, a low voltage system region is formed upon which are implemented signal transmission elements that transmit control signals to each of the driver circuits while electrically insulating the control signals; and power supply wiring for supplying power source voltage to a driver circuit is formed in a conductor layer, and moreover is formed so as to pass through the laminated board underneath a pre-driver element.

It should be noted that, in the power conversion device, the power supply wiring for supplying power source voltage to a lower arm driver circuit may be formed in a conductor layer that is lower than the conductor layer upon which the lower arm driver circuit is implemented.

According to the 4th aspect of the present invention, a power conversion device, comprises: a power module comprising an inverter circuit that comprises, for each phase, an upper arm switching element and a lower arm switching element; a drive circuit board upon which are implemented, for each phase, an upper arm driver circuit that outputs a drive signal to the upper arm switching element and a lower arm driver circuit that outputs a drive signal to the lower arm switching element; and half bridge type pre-driver elements that are connected to the upper arm driver circuits and the lower arm driver circuits, and that comprise level shift circuits that convert control signals inputted to the lower arm driver circuits to upper arm signals; wherein: the drive circuit board is made as a laminated board in which a plurality of conductor layers and a plurality of insulating layers are alternately laminated together, and comprises a first board edge portion to which control terminals for the upper arm switching elements are connected, a second board edge portion to which control terminals for the lower arm switching elements are connected, and a board region located between the first and second board edge portions; in the board region, along with an upper arm implementation region upon which the upper arm driver circuits are implemented and a lower arm implementation region upon which the lower arm driver circuits are implemented being formed for each phase, a low voltage system region is formed upon which are implemented signal transmission elements that transmit control signals to each of the driver circuits while electrically insulating the control signals; and signal wiring that transmits a control signal from a signal transmission element to its corresponding driver circuit is formed in a conductor layer, and moreover is formed so as to pass through the laminated board underneath a pre-driver element.

According to the 5th aspect of the present invention, a power conversion device, comprises: a power module comprising an inverter circuit that comprises, for each phase, an upper arm switching element and a lower arm switching element; a drive circuit board upon which are implemented, for each phase, an upper arm driver circuit that outputs a drive signal to the upper arm switching element and a lower arm driver circuit that outputs a drive signal to the lower arm switching element; and half bridge type pre-driver elements that are connected to the upper arm driver circuits and the lower arm driver circuits, and that comprise level shift circuits that convert control signals inputted to the lower arm driver circuits to upper arm signals; wherein: the drive circuit board is made as a laminated board in which a plurality of conductor layers and a plurality of insulating layers are alternately laminated together, and comprises a first board edge portion to which control terminals for the upper arm switching elements are connected, a second board edge portion to which control terminals for the lower arm switching elements are connected, and a board region located between the first and second board edge portions; in the board region, along with an upper arm implementation region upon which the upper arm driver circuits are implemented and a lower arm implementation region upon which the lower arm driver circuits are implemented being formed for each phase, a low voltage system region is formed upon which are implemented signal transmission elements that transmit control signals to each of the driver circuits while electrically insulating the control signals; and power supply wiring for supplying power source voltage to a driver circuit is formed in a conductor layer, and moreover is formed so as to pass through the laminated board underneath a signal transmission element.

Advantageous Effect of the Invention

According to the present invention, it is possible to make the size of the drive circuit board more compact, while still ensuring good insulation between the various components upon the drive circuit board.

BEST MODES FOR CARRYING OUT THE INVENTION

Preferred embodiments for implementation of the present invention will now be explained with reference to the drawings. The power conversion device according to the present invention may be applied to a hybrid automobile or to a pure electric automobile.

However, as a representative example, the control structure and the circuit structure which are of a hybrid automobile wherein a power conversion device according to an embodiment of the present invention is applied, will be explained with reference to FIGS. 1 and 2.

The power conversion device according to an embodiment of the present invention is an in-vehicle power conversion device for use in an in-vehicle electric mechanical system, and here it will be explained especially, for example, about an inverter device for an electric mechanical system of vehicle driving which is for use in the very hard mounting environment and operational environment. This inverter device for driving the vehicle is fitted to the electric mechanical system for driving the vehicle, and serves as a control device that controls the operation of an electric motor for driving the vehicle, and converts DC power that is supplied from an onboard battery, that constitutes an onboard vehicle power supply, or DC power that is supplied from an onboard power generation device, into AC power of a specified type, thus controlling the operation of the electric motor for driving the vehicle by supplying the resulting AC power to the electric motor for driving the vehicle. Furthermore, since the electric motor for driving a vehicle also can provide a function of acting as a generator, therefore, according to the operation mode of the inverter device, this inverter device for driving the vehicle may also have a function of converting AC power that is generated by the electric motor for driving the vehicle into DC power. The DC power that is thus produced by conversion may be supplied to the onboard battery.

It should be understood that, while the structure of this embodiment is optimized as an inverter device for driving a vehicle such as an automobile or a truck or the like, it may also be applied to inverter devices of other types. For example, it could also be applied to an inverter device for a train or a ship or an aircraft or the like, to an inverter device for use in industry as a control device for an electric motor that drives a machine in a workplace, or to an inverter device for household use that is employed as a control device for a home solar electricity generating system and for an electric motor that drives an item of electrified household equipment or the like.

Figure 1:
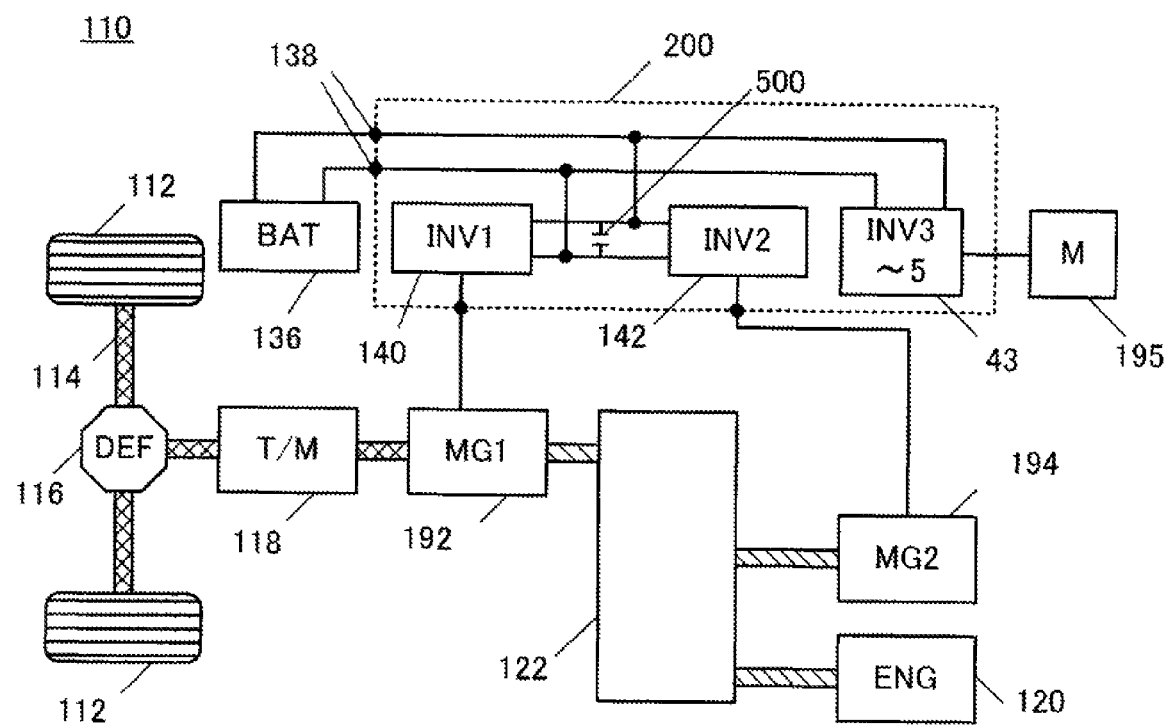
FIG. 1 is a figure showing control blocks of a hybrid automobile.

FIG. 1 is a figure showing control blocks of a hybrid automobile. In FIG. 1, a hybrid electric automobile (hereinafter termed a "HEV") 110 is a kind of an electrically operated vehicle that is equipped with two vehicle drive systems. One of these is an engine system that utilizes as its power source an engine 120, that is an internal combustion engine. This engine system is used as the principal source of drive power for driving the HEV 110. The other drive system is an onboard electric mechanical system that utilizes two motor-generators 192 and 194 as power sources. This onboard electric mechanical system is principally used as a drive power source for the HEV 110 and as an electrical power generating source for the HEV 110. The motor-generators 194 and 194 may be, for example, synchronous motors or induction motors, and since, in terms of their method of operation, they function both as motors and as generators, in this specification they will be termed "motor-generators".

A front wheel shaft 114 is rotatably supported at the front portion of the body of the vehicle. And a pair of front wheels 112 are provided at the ends of the front wheel shaft 114. A rear wheel shafts (not shown in the drawing) is rotatably supported at the rear portion of the vehicle body. And a pair of rear wheels are provided at the ends of the rear wheel shaft. While, with the HEV 110 of this embodiment, the so-called front wheel drive configuration is employed in which the main wheels that are powered by drive force are the front wheels 112, and the auxiliary wheels that free-wheel are the rear wheels, the present invention could also be applied to the reverse configuration, i.e. to a HEV that employs the rear wheel drive configuration.

A front wheel side differential gear system 116 (hereinafter termed the "front wheel side DEF") is provided at the central portion of the two front wheel shaft 114. The front wheel shaft 114 is mechanically connected to output sides of this front wheel side DEF 116. Furthermore, the output shaft of a speed change mechanism 118 is mechanically connected to an input side of the front wheel side DEF 116. The front wheel side DEF 116 is a differential type drive force distribution mechanism that distributes the rotational drive force transmitted and speed-changed by the speed change mechanism 118 between the left and right sides of the wheel shaft 114. The output side of the motor-generator 192 is mechanically connected to the input side of the speed change mechanism 118. Furthermore, the output side of the engine 120 and the output side of the motor-generator 194 are mechanically connected to the input side of the motor-generator 192 via a power distribution mechanism 122. It should be understood that the motor-generators 192 and 194 and the power distribution mechanism 122 are housed in the interior of the casing of the speed change mechanism 118.

In this embodiment, the motor-generators 192 and 194 are synchronous motors whose rotors incorporate permanent magnets. Drive control of the motor-generators 192 and 194 is performed by AC power that is supplied to their fixed armature windings being controlled by inverter devices 140 and 142. A battery 136 is electrically connected to the inverter devices 140 and 142, and accordingly transfer of power can be performed between the battery 136 and the inverter devices 140 and 142.

The inverter devices 140 and 142 control the phase, frequency, and power of the AC that is supplied to the motor-generators 192 and 194. For example, by AC power having a phase leading with respect to the rotors of the motor-generators 192 and 194 being supplied, the motor-generators 192 and 194 may generate torque. On the other hand, by AC power having a delayed phase being generated, the motor-generators 192 and 194 may operate as generators, so that the motor-generators 192 and 194 are operated in the regenerative braking state.

The HEY 110 of this embodiment includes two electric drive/generator units, i.e. a first electric drive/generator unit that includes the motor-generator 192 and the inverter device 140, and a second electric drive/generator unit that includes the motor-generator 194 and the inverter device 142; and usage is divided between these according to the current operational state. In other words, in the situation in which the vehicle is being driven by the drive force from the engine 120, if the drive torque of the vehicle is to be assisted, the second electric drive/generator unit is operated as an electricity generation unit by the power from the engine 120, while the first electric drive/generator unit is operated as an electric drive unit using the power that is generated in this way. Moreover, in a similar situation, if the speed of the vehicle is to be assisted, sometimes the first electric drive/generator unit is operated as an electricity generation unit by the power from the engine 120, while the second electric drive/generator unit is operated as an electrical drive unit by the power that is obtained in this way.

Furthermore, with this embodiment, it is possible to drive the vehicle only with the drive force of the motor-generator 192, so as to operate the first electric drive/generator unit as an electrical drive unit using the power of the battery 136. Yet further, with this embodiment, by operating either the first electric drive/generator unit or the second electric drive/generator unit to generate electricity with power from the engine 120, or with power from the vehicle wheels, it is possible to charge up the battery 136.

The battery 136 is also used as a power supply for driving an auxiliary machinery motor 195. Such auxiliary machinery may be, for example, a motor that drives a compressor for an air conditioner, or a motor that drives a hydraulic pump for control. DC power is supplied from the battery 136 to the inverter device 43, and is converted into AC power by the inverter device 43 and supplied to the motor 195. This inverter device 43 is endowed with a function similar to that of the inverter devices 140 and 142, and controls the phase, the frequency, and the power of the AC that it supplies to the motor 195. While the maximum conversion power of the inverter device 43 is smaller than those of the inverter devices 140 and 142 since the capacity of the motor 195 is smaller than the capacities of the motor-generators 192 and 194, the circuit structure of the inverter device 43 is fundamentally the same as the circuit structures of the inverter devices 140 and 142.

Furthermore, a capacitor module 500 is in close electrical relationship with the inverter devices 140, 142 and 43. Moreover, these devices all have the common feature of needing countermeasures against generation of heat. Yet further, it is desirable to make the volumes of the devices as small as possible. From these points of view, in the power conversion device 200 that is described in detail hereinafter, the inverter devices 140 and 142, the inverter device 43, and the capacitor module 500 are housed within the chassis of the power conversion device 200. With this type of structure, it is possible to implement a system that is compact and whose reliability is high.

Yet further, by housing the inverter devices 140, 142, and 43 and the capacitor module 500 within a single chassis, the beneficial effects are obtained that it is possible to simplify the wiring and to implement countermeasures against noise. Yet further, it is possible to reduce the inductances in the circuitry that connects the capacitor module 500 and the inverter devices 140, 142, and 43, and due to this not only is it possible to reduce spike voltages, but also it is possible to anticipate reduction of heat generation and enhancement of heat dissipation efficiency.

Next, the circuit structure of the inverter devices 140 and 142 and the inverter device 43 will be explained using FIG. 2. It should be understood that, in the embodiment shown in FIGS. 1 and 2, an example is presented in which each of the inverter devices 140, 142, and 43 is constructed individually. However, since each of the inverter devices 140, 142, and 43 has similar circuit structure and operates in a similar manner and has similar functions, here the inverter device 140 will be explained as a representative example.

Figure 2:
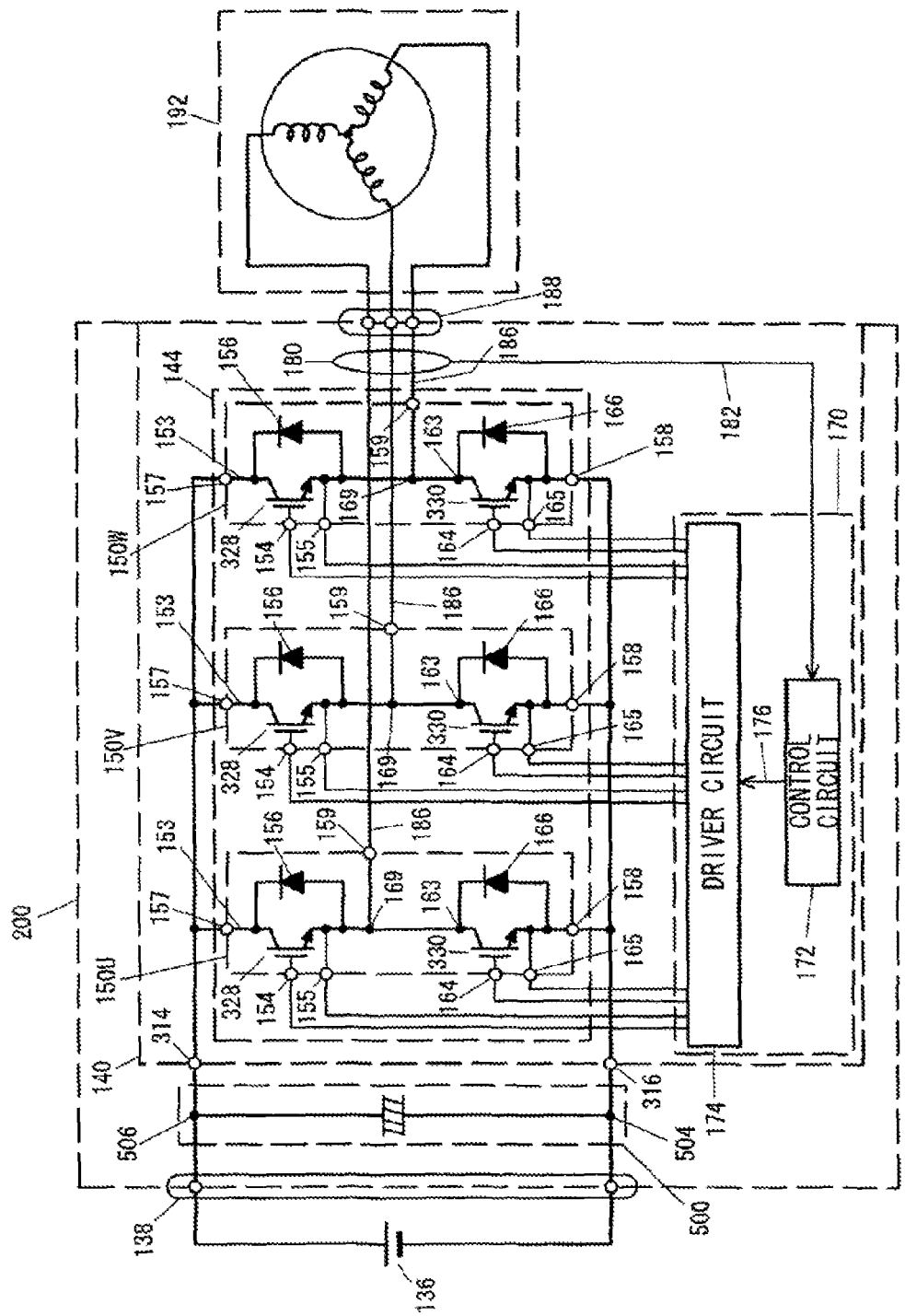
FIG. 2 is a figure for explanation of the electric circuit structure of an inverter device.

As shown in FIG. 2, the power conversion device 200 includes this inverter device 140 and the capacitor module 500; and the inverter device 140 includes a inverter circuit 144 and a control unit 170. The inverter circuit 144 is built as a three phase bridge circuit, and includes three upper and lower arm series circuits 150 (150U through 150W) that correspond to the U phase, the V phase, and the W phase. These upper and lower arm series circuits 150U, 150V, and 150W are electrically connected in parallel between a DC positive terminal 314 and a DC negative terminal 316, that are respectively electrically connected to the positive electrode side and the negative electrode side of the battery 136.

Each of these upper and lower arm series circuits 150 includes an IGBT (Insulated Gate Bipolar Transistor) 328 and a diode 156 that operate as an upper arm, and an IGBT 330 and a diode 166 that operate as a lower arm. AC power lines (i.e. AC bus bars) 186 are connected to the motor-generator 192 at AC terminals 159 for intermediate points (i.e. intermediate electrodes) 169 of each of the upper and lower arm series circuits 150. The AC power lines 186 are electrically connected to phase windings that correspond to the armature windings of the motor-generator 192, via an AC connector 188. The control unit 170 includes a driver circuit 174 that controls the operation of the inverter device circuit 144, and a control circuit 172 that supplies control signals to the driver circuit 174 via signal lines 176.

The IGBTs 328 and 330 in the upper and lower arms are semiconductor elements for power switching, and are operated by drive signals outputted from the control unit 170 so as to convert DC power supplied from the battery 136 into three phase AC power. This power that has been converted is supplied to the armature windings of the motor-generator 192. And, as described above, the inverter device 140 is also capable of converting the three phase AC power generated by the motor-generator 192 into DC power.

In this embodiment, the IGBTs 328 and 330 are used as the semiconductor elements for power switching. The IGBTs 328 and 330 have respective collector electrodes 153 and 163, emitter electrodes (signal emission electrode terminals) 155 and 165, and gate electrodes (gate electrode terminals) 154 and 164. Diodes 156 and 166 are electrically connected between the collector electrodes 153 and 163 of the IGBTs 328 and 330 and their emitter electrodes, as shown in the figure. Each of the diodes 156 and 166 has two electrodes, a cathode electrode and an anode electrode, with the cathode electrodes being respectively electrically connected to the collector electrodes of the IGBTs 328 and 330 while the anode electrodes are respectively electrically connected to the emitter electrodes of the IGBTs 328 and 330, so that the forward directions of the diodes 156 and 166 are in the directions from the emitter electrodes of the IGBTs 328 and 330 towards their collector electrodes.

It would also be acceptable to use MOSFETs (Metallic Oxide Semiconductor type Field Effect Transistors) as the semiconductor elements for power switching. It should be understood that, since MOSFETs include parasitic diodes between their source electrodes and their drain electrodes, with the directions from the drain electrodes towards the source electrodes being the forward directions of these diodes, accordingly it is not necessary to provide separate diodes (the diodes 156 and 166), as is the case with IGBTs.

The upper and lower arm series circuits 150 are provided for each of the three phases (150U through 150W), corresponding to each of the phase armature windings of the motor-generator 192. Each of the three upper and lower arm series circuits 150U, 150V and 150W is respectively connected to the U phase, the V phase, or the W phase of the motor generator 192 via the AC terminal 159 and the intermediate electrode 169, to which the emitter electrodes of the IGBTs 328 and the collector electrodes 163 of the IGBTs 330 are connected. The upper and lower arm series circuits are electrically connected in parallel with one another. The collector electrodes 153 of the upper arm IGBTs 328 are each electrically connected (i.e. are connected via DC bus bars) to the positive electrode side capacitor electrode of the capacitor module 500 via the positive terminals 157 (i.e. the P terminals). And the emitter electrodes of the lower arm IGBTs 330 are each electrically connected (via DC bus bars) to the negative electrode side capacitor electrode of the capacitor module 500 via the negative terminals 158 (i.e. the N terminals). The intermediate electrodes 169 at the connection points between the arms (i.e. at the connection portions between the emitter electrodes of the upper arm IGBTs 328 and the collector electrodes of the lower arm IGBTs 330) are electrically connected to the armature windings of the motor-generator 192 of the corresponding phases via an AC connector 188.

The capacitor module 500 acts as a smoothing circuit for suppressing fluctuations of the DC voltage generated by the switching operation of the IGBTs 328 and 330. Via DC connectors 138, the positive electrode side of the battery 136 is electrically connected to the positive electrode side capacitor electrode of the capacitor module 500, while the negative electrode side of the battery 136 is connected to the negative electrode side capacitor electrode of the capacitor module 500. Due to this, the capacitor module 500 is connected between the collector electrodes 153 of the upper arm IGBTs 328 and the positive electrode side of the battery 136, and between the emitter electrodes of the lower arm IGBTs 330 and the negative electrode side of the battery 136; in other words, it is electrically connected to the battery 136 and to the upper and lower arm series circuits 150 in parallel.

The control unit 170 is a circuit for operating the IGBTs 328 and 330, and includes the control circuit 172 and the driver circuit 174. The control circuit 172 generates timing signals for controlling the timings at which the IGBTs 328 and 330 are switched, on the basis of information that is inputted from other control devices or sensors or the like. And the driver circuit 174 generates a drive signal for causing this switching operation of the IGBTs 328 and 330 on the basis of these timing signals outputted from the control circuit 172.

The control circuit 172 includes a micro computer (hereinafter termed a "microcomputer") for performing processing for calculating the switching timings for the IGBTs 328 and 330. As input information to this microcomputer, a target torque value that is requested for the motor-generator 192, values of the currents that are currently being supplied to the armature windings of the motor-generator 192 from the upper and lower arm series circuits 150, and the position of the magnetic poles of the rotor of the motor-generator 192, are inputted. The target torque value is a value based upon a command signal outputted from a higher level control device not shown in the figures. And the current values are values that are detected on the basis of a detection signal outputted from a current sensor 180. Moreover, the magnetic pole position is a value that is detected on the basis of a detection signal outputted from a magnetic pole rotation sensor (not shown in the figures) that is provided to the motor-generator 192. While in this first embodiment an example is presented and explained in which the AC current value for each of the three phases is detected, it would also be acceptable to arrange to detect AC current values for only two of the phases.

The microcomputer incorporated in the control circuit 172 calculates current command values for the d and q axes of the motor-generator 192 on the basis of the target torque value. Furthermore, the microcomputer then calculates voltage command values for the d and q axes on the basis of the differences between the current command values for the d and q axes that are the result of the above calculation and the current values for the d and q axes that have been detected. Then the microcomputer converts these voltage command values for the d and q axes that have been calculated into voltage command values for the U phase, the V phase, and the W phase on the basis of the magnetic pole position that has been detected. And the microcomputer generates modulated pulse form waves on the basis of comparing together a fundamental wave (a sine wave) based upon the voltage command values for the U phase, the V phase, and the W phase and a carrier wave (a triangular wave), and outputs this modulated wave that has been generated to the driver circuit 174 as a PWM (Pulse Width Modulated) signal.

When driving a lower arm, the driver circuit 174 amplifies the PWM signal and outputs it as a drive signal to the gate electrode of the IGBT 330 of the lower arm. On the other hand, when driving an upper arm, it amplifies the PWM signal after having shifted the level of the reference potential of this PWM signal to the level of the reference potential of the upper arm, and outputs it as a drive signal to the gate electrode of the IGBT 328 of the upper arm. Due to this, each of the IGBTs 328 and 330 performs switching operation on the basis of the drive signal that is inputted to it.

Moreover, the control unit 170 performs detection of anomalies such as excess current, excess voltage, excess temperature and so on, and thereby protects the upper and lower arm series circuits 150U through 150W. For this purpose, sensing information is inputted to the control unit 170. For example, information about the current that flows to the emitter electrode of each of the IGBTs 328 and 330 is inputted from the signal emission electrode terminals 155 and 165 of each arm to the corresponding drive unit (IC). Based upon this, each of the drive units (ICs) performs excess current detection, and, if it has detected excess current, stops the switching operation of the corresponding IGBT 328 or 330, thus protecting the corresponding IGBT 328 or 330 from excessive current. Furthermore, information about the temperatures of the upper and lower arm series circuits 150U through 150W is inputted to the microcomputer from temperature sensors (not shown in the figures) that are provided to the upper and lower arm series circuits 150U through 150W. Yet further, information about the voltages at the DC positive electrode sides of the upper and lower arm series circuits 150U through 150W is inputted to the microcomputer. The microcomputer performs excess temperature detection and excess voltage detection on the basis of this information, and, if it detects excess temperature or excess voltage, stops the switching operation of all of the IGBTs 328 and 330, thus protecting the upper and lower arm series circuits 150W through 150W from excess temperature and excess voltage.

As shown in FIG. 2, the upper and lower arm series circuits 150U through 150W are series circuits of the upper arm IGBTs 328 and the upper arm diodes 156, and series circuits of the lower arm IGBTs 330 and the lower arm diodes 166. The operation of the IGBTs 328 and 330 of the upper and lower arms of the inverter circuit 144 to go continuous and discontinuous is changed over in a predetermined order, and the current in the stator windings of the motor-generator 192 during this changeover flows in the circuits constituted by the diodes 156 and 166.

As shown in the figure, the upper and lower arm series circuits 150U through 150W are provided with positive terminals (P terminals) 157, negative terminals (N terminals) 158, AC terminals 159 from the upper and lower arm intermediate electrodes 169, upper arm signal terminals (signal sensing emitter electrode terminals) 155, upper arm gate electrode terminals 154, lower arm signal terminals (signal sensing emitter electrode terminals) 165, and lower arm gate electrode terminals 164. Furthermore, the power conversion device 200 has the DC connector 138 at its input side and the AC connector 188 at its output side. The power conversion device 200 is connected to both the battery 136 and the motor-generator 192 via these two connectors 138 and 188, respectively. It should be understood that it would also be acceptable to provide a power conversion device having a circuit structure in which, for each phase, two upper and lower arm series circuits are connected in parallel, as circuits that generate output for each phase of the three phase AC to be outputted to the motor-generator.

Figure 3:
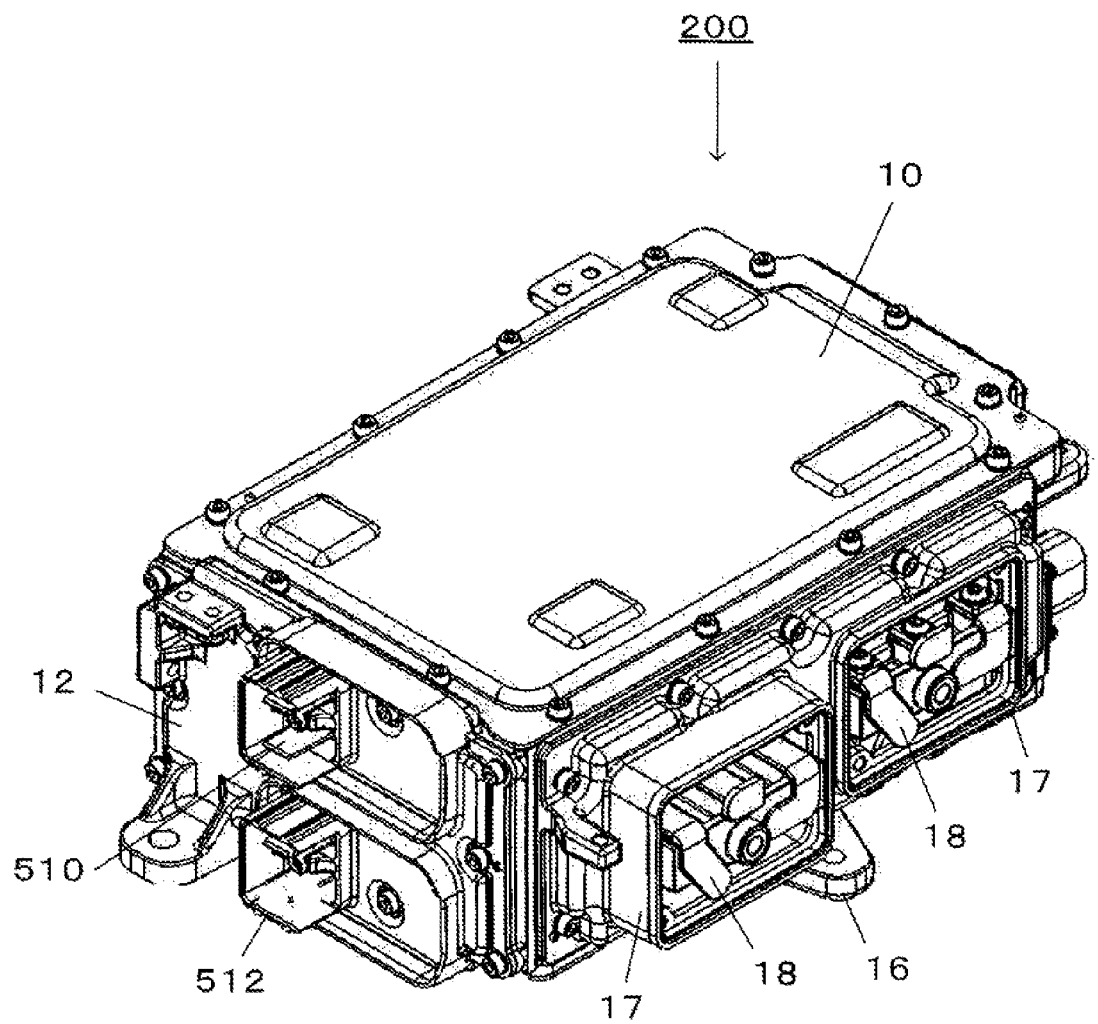
FIG. 3 is an external perspective view showing the appearance of an inverter device according to an embodiment of the present invention.
Figure 4:
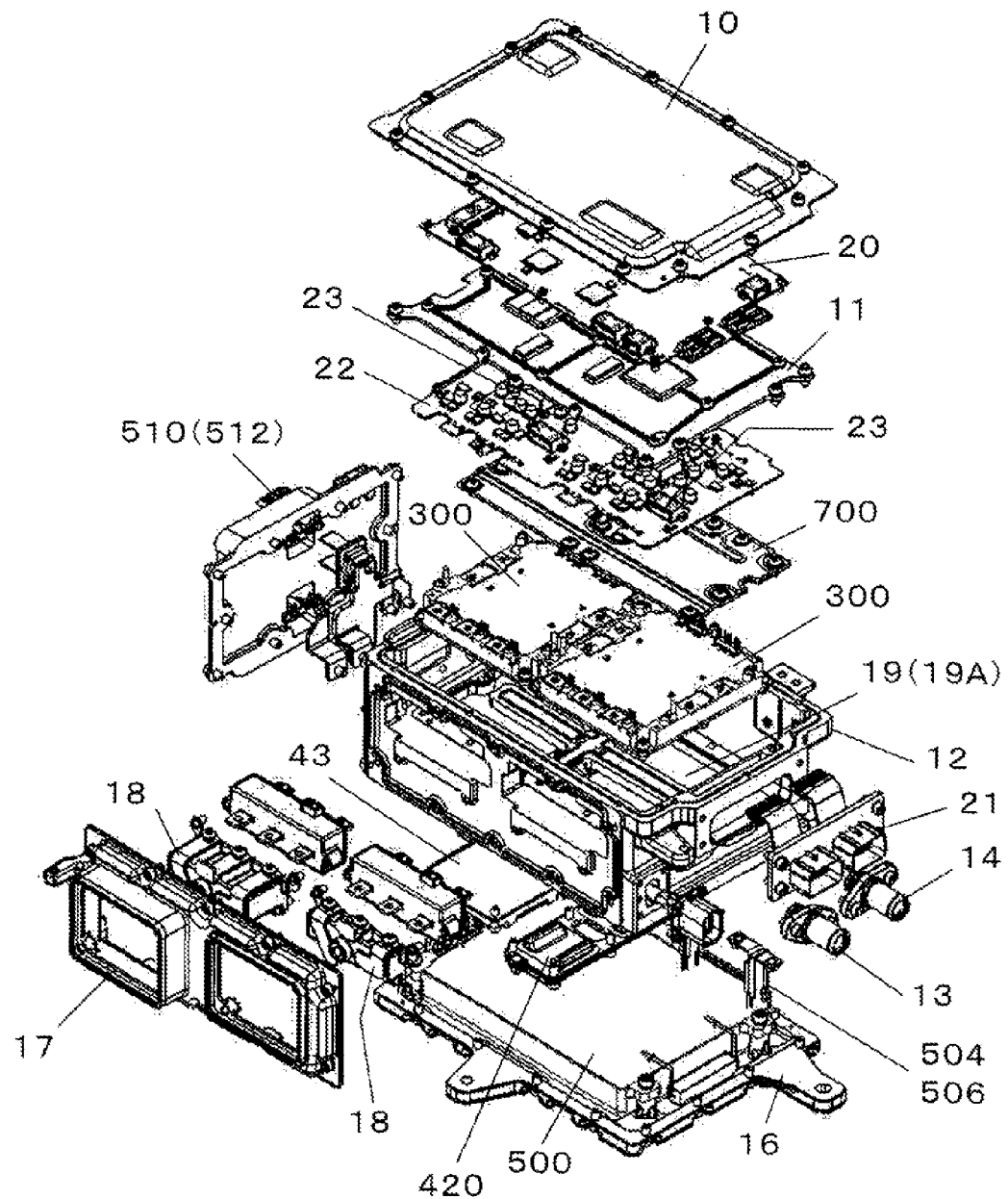
FIG. 4 is an exploded perspective view showing the internal structure of this inverter device.

FIG. 3 is an external perspective view showing the appearance of the power conversion device 200 according to an embodiment of the present invention. Furthermore, FIG. 4 is a perspective view in which the overall structure of this power conversion device 200 is decomposed into its various structural elements. As shown in FIG. 3, the externally visible components of the power conversion device 200 according to this embodiment include: a chassis 12 whose top and bottom surfaces are approximately rectangular; an upper casing portion 10 for closing an opening at the upper portion of the chassis 12; and a lower casing portion 16 for closing an opening at the lower portion of the chassis 12. By making the shape of the bottom surface side or the top surface side of the chassis 12 as an approximate rectangle, the advantageous effects are obtained that it becomes simple and easy to fit the chassis 12 to the vehicle, and also that it is easy to produce. It should be understood that a cooling water inlet conduit 13 and a cooling water outlet conduit 14 are provided upon the outer surface of the chassis 12 on one of its short sides, although they are not visible in FIG. 3 because they are on the unshown side.

AC terminal cases 17 for connection to the motor-generators 192 and 194 are provided upon the outer surface of the power conversion device 200 on one of its long sides. AC terminals 18 that are provided within these AC terminal cases 17 are used for electrical connection to power modules 300 shown in FIG. 4 and to the motor-generators 192 and 194. AC current that is outputted from these power modules 300 that will be described hereinafter is transmitted to the motor-generators 192 and 194 via these AC terminals 18.

A DC (battery) negative electrode side connection terminal portion 510 and a DC (battery) positive electrode side connection terminal portion 512 are provided upon the outer surface of the chassis 12 at one of its short sides. This DC (battery) negative electrode side connection terminal portion 510 and DC (battery) positive electrode side connection terminal portion 512 are electrically connected to the battery 136 and the capacitor module 500. On the other hand, as shown in FIG. 4, connectors 21 are provided upon the outer surface of the chassis 12 at the other one of its short sides, in other words at the side where the conduits 13 and 14 are provided. Various types of signal from the exterior are transmitted via these connectors 21 to a control circuit board 20 that is housed within the chassis 12. In this manner, the terminal portions 510 and 512 and the connectors 2 are provided upon the outer surface of the chassis 12, on mutually opposite short sides thereof. Due to this, it is possible to reduce noise that enters the chassis 12 from the DC (battery) negative electrode side connection terminal portion 510 and is then propagated to the connector 21, and thus it is possible to enhance the controllability of the motor by the control circuit board 20.

As shown in FIG. 4, a cooling jacket 19A in which an internal cooling water flow conduit 19 is formed is provided in the interior of the chassis 12, and two apertures are formed in the upper portion of this cooling jacket 19A along the direction of flow. The two power modules 300 are fixed to the upper surface of this cooling jacket 19A in such a manner as to block off these apertures. Seal members (for example, O-ring seals) for preventing leakage of cooling water are provided between the power modules 300 and the cooling jacket 19A. And fins 305 (refer to FIG. 5) for heat dissipation are provided to each of the power modules 300, and these fins 305 upon the power modules 300 project into the cooling water flow conduit 19 through the respective apertures in the cooling jacket 19A.

Apertures for making it easier to perform aluminum casting are formed upon the lower surface of the cooling jacket 19A, and these apertures are blocked by a lower cover 420. A seal member for preventing leakage of cooling water is provided between this lower cover 420 and the chassis 12. Furthermore, the auxiliary machinery inverter device 43 is fitted to the lower surface of the cooling jacket 19A. This auxiliary machinery inverter device 43 is provided with an inverter circuit that has a structure similar to that of the inverter circuit 144 shown in FIG. 2. The auxiliary machinery inverter device 43 is fixed to the lower surface of the cooling jacket 19A, so that a heat dissipation metal surface of a power module that is internally housed therein faces the lower surface of the cooling jacket 19A.

Furthermore, the lower casing portion 16 is provided under the cooling jacket 19A. The capacitor module 500 is provided in this lower casing portion 16. This capacitor module 500 is fixed to the inner surface of the bottom plate of the lower casing portion 16, so that a heat dissipation surface of its metal casing contacts that inner surface of the bottom plate of the lower casing portion 16. With this type of construction, it is possible to cool the power module 300 and the inverter device 43 with good efficiency by utilizing both the upper surface and also the lower surface of the cooling jacket 19A, and this is linked with making the power conversion device as a whole more compact.

By cooling water from the cooling water inlet and outlet conduits 13 and 14 flowing in the cooling water flow conduit 19, the heat dissipation surfaces (i.e. the heat dissipation fins) provided to the two power modules 300 that are provided side by side are cooled, and thereby, as a whole, the two power modules 300 are cooled. The auxiliary machinery inverter device 43 that is provided at the lower surface of the cooling jacket 19A is also cooled in a similar manner.

Furthermore, by the chassis 12 to which the cooling jacket 19A is provided being cooled, the lower casing portion 16 that is provided at the lower portion of the chassis 12 is also cooled. As a result, the heat of the capacitor module 500 is thermally conducted to the cooling water via the lower casing portion 16 and the chassis 12, so that the capacitor module 500 is cooled.

A laminated conductor board 700 for electrically connecting between the power modules 300 and the capacitor module 500 is disposed above the power modules 300. This laminated conductor board 700 straddles the two power modules 300, and is made broad in the direction in which the two power modules 300 are arranged. Furthermore, the laminated conductor board 700 is connected to positive electrode side and negative electrode side capacitor terminals 504 and 506 of the capacitor module 500.

The control circuit board 20 and a drive circuit board 22 are disposed above the laminated conductor board 700. The driver circuit 174 shown in FIG. 2 is mounted to this drive circuit board 22. And the control circuit 172 including a CPU shown in FIG. 2 is mounted to the control circuit board 20. Furthermore, a metallic base plate 11 is disposed between the drive circuit board 22 and the control circuit board 20. This metallic base plate 11, along with providing the function of acting as an electromagnetic shield for the group of circuits mounted upon the boards 22 and 20, also carries away heat generated in the drive circuit board 22 and the control circuit board 20, and provides an operation of cooling those boards.

Inter-board connectors 23 are provided upon the drive circuit board 22, and pass through the metallic base plate 11 and establish connection with the group of circuits on the control circuit board 20. Furthermore, the connectors 21 are connected to the control circuit board 20, and transmission of signals to and from the onboard battery 136 that is provided exterior to the power conversion device, in other words a lithium battery module, is performed by utilizing these connectors 21. Signals are sent to the control circuit board 20 from this lithium battery module specifying the state of the battery or specifying the state of charge of the lithium batteries or the like. The signal lines 176 shown in FIG. 2 (not shown in FIG. 4) are connected to an inter-board connectors 23. Via these signal lines 176, switching timing signals for the inverter circuit are transmitted from the control circuit board 20 to the drive circuit board 22. The drive circuit board 22 generates gate drive signals on the basis of these switching timing signals, and applies these gate drive signals to the gate electrodes of the power modules 300.

Openings are formed at the upper end portion and the lower end portion of the chassis 12. These openings are respectively blocked by the upper casing portion 10 and the lower casing portion 16 being fixed to the chassis 12 by engagement components such as, for example, screws or bolts or the like. As previously described, the cooling jacket 19A is provided almost at the center in the height direction of the chassis 12. By the apertures at the upper surface side of the cooling water flow conduit 19 that is formed in the cooling jacket 19A being covered by the power modules 300 while the apertures at its lower surface are covered by the lower cover 420, the cooling water flow conduit 19 that joins between the cooling water inlet conduit 13 and the cooling water outlet conduit 14 is defined in the interior of the cooling jacket 19A. During assembly, testing of the cooling water flow conduit 19 for water leakage is performed. And, after this water leakage test has been passed, the task is performed of attaching the boards and the capacitor module 500 from the openings of the upper and lower portions of the chassis 12. The productivity is enhanced by employing this construction in which first the cooling jacket 19A is arranged in the center of the chassis 12 in this manner, and next the task is performed of fixing the necessary components from the apertures at the upper end portion and the lower end portion of the chassis 12. Furthermore, both the productivity and the reliability are enhanced by it becoming possible initially to perfect the cooling water flow conduit 19, and then to attach the other components after having tested for water leakage.

Figure 5:
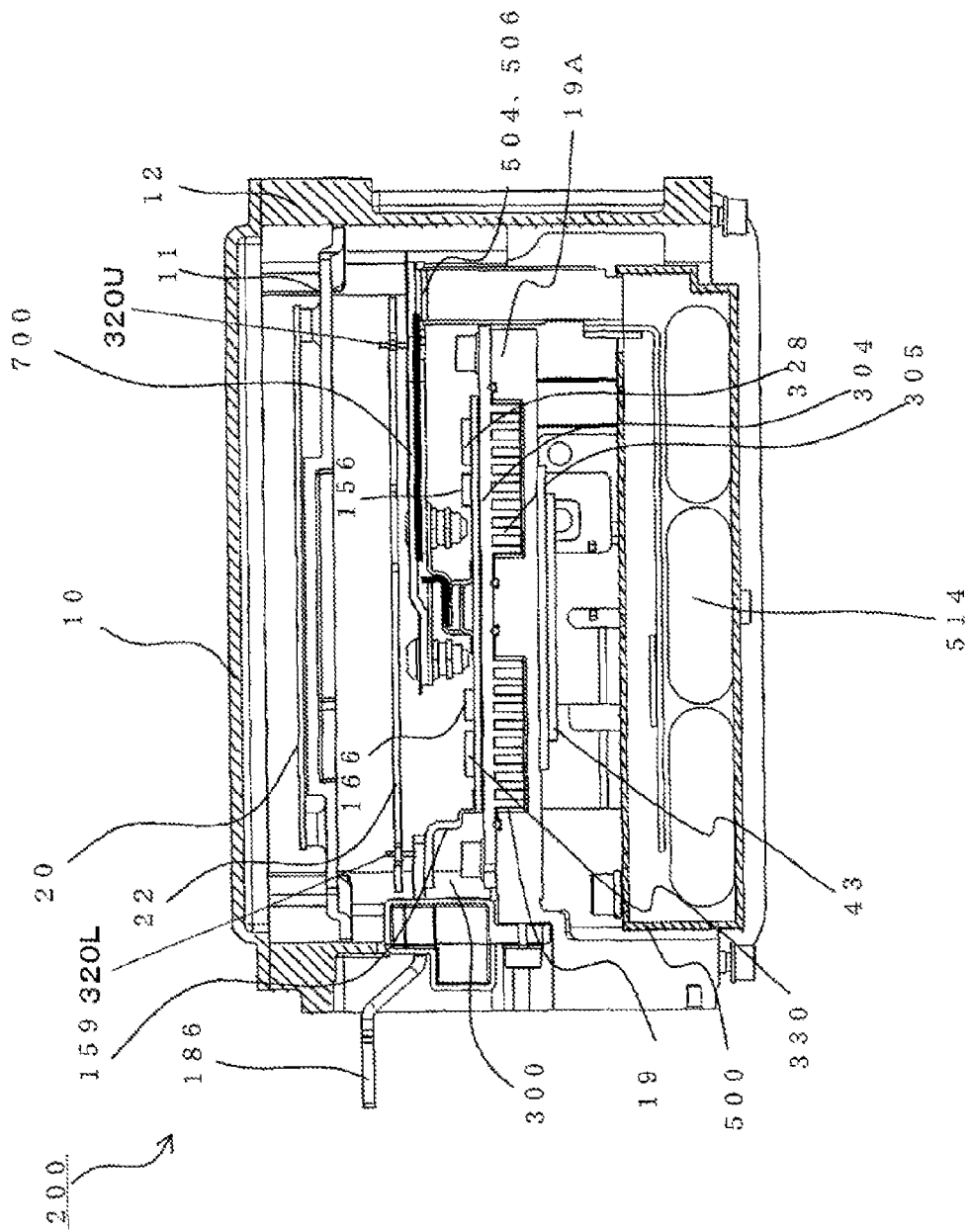
FIG. 5 is a sectional view of the inverter device.

FIG. 5 is a sectional view of this power conversion device 200. As described above, the cooling jacket 19A is formed integrally, almost in the center of the chassis 12 in the vertical direction, in such a manner as to partition the interior space within the chassis 12 into upper and lower portions. The cooling water flow conduit 19 is formed in the cooling jacket 19A, and its water path on the left side as seen in the figure is an inward conduit from the cooling water inlet conduit 13, while its water path on the right side is a return conduit that is connected to the cooling water outlet conduit 14. The one ends of the plate shaped AC power lines 186 are connected to the AC terminals of the power modules 300. And the other ends of the AC power lines 186 are formed as AC connectors that project from the interior of the power conversion device 200.

The power modules 300 are fixed to the cooling jacket 19A, so as to straddle its inward conduit and its return conduit. A metallic base 304 is provided to the power modules 300 for heat dissipation, and the IGBTs 328 and 330 and the diodes 156 and 166 of the power modules 300 are mounted upon insulating boards (not shown in the figures) that are adhered upon the upper surface of the metallic base 304. A large number of cooling fins 305 are formed on the lower surfaces of the metallic bases 304. It should be understood that the cooling fins 305 of this embodiment are made as pin fins, but the fins are not limited to being pin fins; they could also be straight fins or the like.

The IGBTs 328 and the diodes 156 for the upper arms are provided upon the metallic bases 304 at the return conduit side of the cooling water flow conduit 19. On the other hand, the IGBTs 330 and the diodes 166 for the lower arms are provided at the inward conduit side of the cooling water flow conduit 19. Moreover, the cooling fins 305 are formed so as to be divided between two regions: the lower surface of the region where the IGBTs 328 and the diodes 156 for the upper arms are provided, and the lower surface of the region where the IGBTs 330 and the diodes 166 for the lower arms are provided. The cooling fins 305 that are provided in these regions project from the apertures that are formed in the cooling water flow conduit 19 into the cooling water flow conduit 19, and are directly cooled by the cooling water in the flow conduit. Moreover, the auxiliary machinery inverter device 43 is fixed to the lower surface of the cooling jacket 19A.

The drive circuit board 22 upon which the driver circuit 174 shown in FIG. 2 (but not shown in this figure) is implemented is disposed above the power modules 300. The metallic base plate 11 for enhancing the advantageous effects of heat dissipation and electromagnetic shielding is provided over this drive circuit board 22, and furthermore the control circuit board 20 is disposed over this structure. It should be understood that the control circuit 172 shown in FIG. 2 (but not shown in this figure) is mounted upon the control circuit board 20. Upper arm control terminals 320U (in FIG. 6 that will be described hereinafter, 320UU through 320UW) and lower arm control terminals 320L (in FIG. 6, 320LU through 320LW) of the power modules 300 extend upwards from the casings of the power modules 300, and pass through holes for terminal portions that are formed in the drive circuit board 22. These control terminals 320U and 320L are joined by solder fixing or welding or the like to terminal portions upon the drive circuit board 22.

Figure 6:
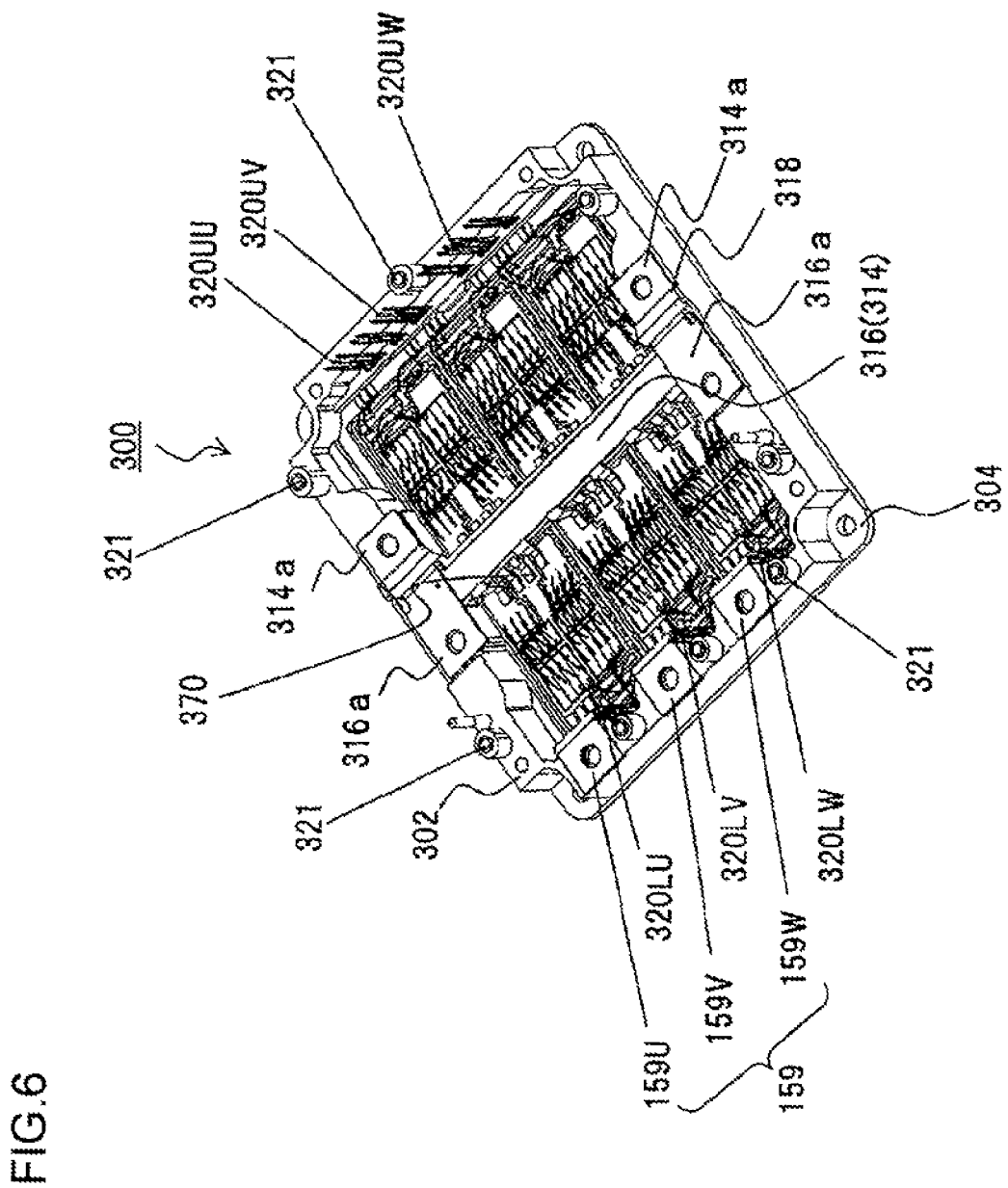
FIG. 6 is a perspective view showing a power module.
Figure 7:
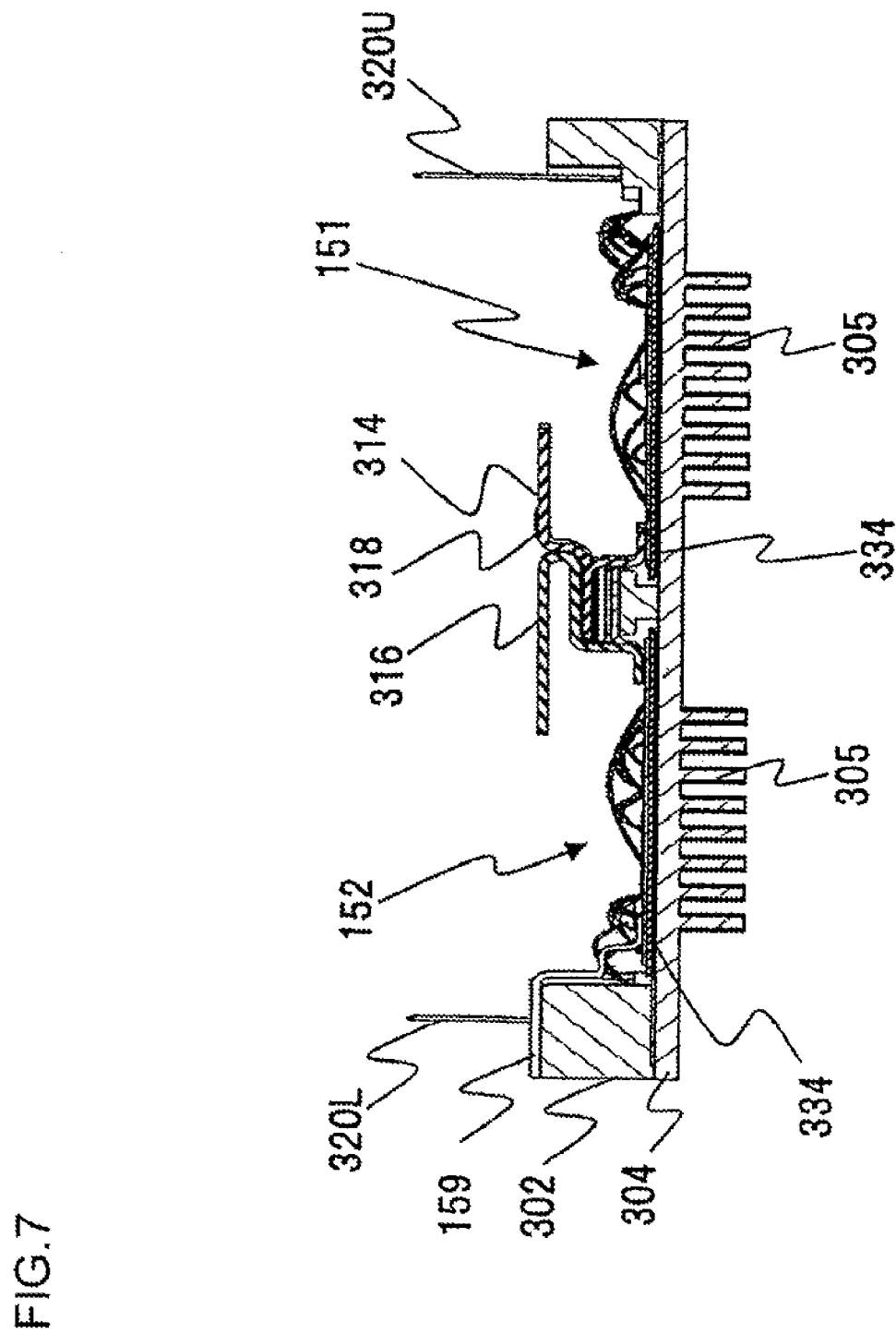
FIG. 7 is a sectional view of this power module.

The details of the power modules 300 will now be explained using FIGS. 6 through 8. FIG. 6 is a perspective view showing a power module 300 of this embodiment. FIG. 7 is a sectional view of the power module 300. And FIG. 8 is a figure showing the upper and lower arm series circuits 150V for the V phase that are disposed upon the metallic base 304.

This power module 300 principally includes a power module case 302, a semiconductor module portion that is provided within the power module case 302, a metallic base 304, and connection terminals for establishing connections to the exterior. The power module case 302 is made from an electrically insulating material such as a resin material or the like. And, for example, Cu, Al, AlSiC or the like may be used as the metallic material for the metallic base 304. As the connection terminals, for example, control terminals 320U or 320L for establishing connections to the drive circuit, DC positive terminals 314 and DC negative terminals 316 for establishing connections to the capacitor module 500, AC terminals 159 for establishing connections to the motor-generator, and so on, may be provided. The power module case 302 is built as a framelike body that is fixed upon the metallic base 304, and has a beam shaped portion at its center, as shown in FIG. 7. Semiconductor elements and wiring and so on that constitute the semiconductor module portions for the upper and lower arms are provided in two rectangular regions that are surrounded by this framelike body including the beam shaped portion.

Figure 8:
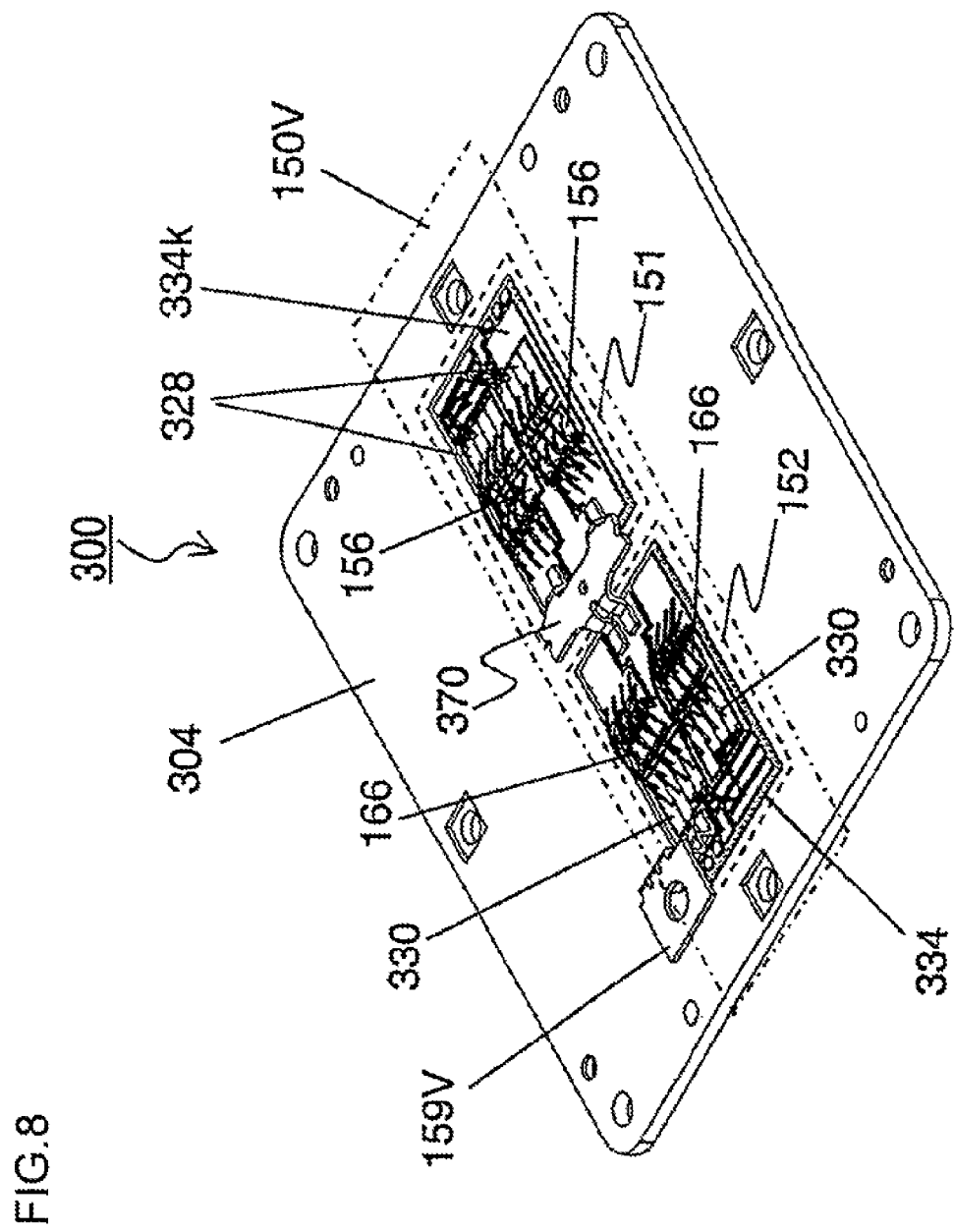
FIG. 8 is a figure showing upper and lower arm series circuits for the V phase.

FIG. 8 is a figure showing the upper and lower arm series circuit 150V that is mounted upon the metallic base 304, and the upper and lower arm series circuits 150U and 150W for the U phase and the W phase have similar structures. The upper and lower arm series circuit 150V includes an upper arm circuit 151 and a lower arm circuit 152, and the upper arm circuit 151 and the lower arm circuit 152 are connected by a terminal 370. The beam shaped portion described above of the power module case 302 is positioned between the upper arm circuit 151 and the lower arm circuit 152, and the terminal 370 is provided so as to straddle this beam shaped portion.

Insulating boards 334 are provided to both the upper arm circuit 151 and the lower arm circuit 152, and the IGBTs 328 and 330 and the diodes 156 and 166 are mounted upon these insulating boards. The insulating boards 334 are made from an electrically insulating material that has good thermal conductivity; for example, they may be made from ceramic board, and also they may be made as thin insulating sheets. In this embodiment, the insulating boards 334 are made from a ceramic that has good thermal conductivity.

Metallic patterns are formed upon the upper surface and the lower surface of the insulating board 334. The metallic pattern on the lower surface side is a solid pattern that is formed over the entire lower surface. By this solid pattern being joined upon the metallic base 304 by solder or the like, the insulating board 334 is fixed upon the metallic base 304. On the other hand, the metallic pattern upon the upper surface side is formed as a wiring circuit pattern 334k, and the IGBTs 328 and 330 and the diodes 156 and 166 are mounted upon this wiring circuit pattern 334k. When mounting the IGBTs 328 and 330 and the diodes 156 and 166, electrodes that are formed upon their rear surfaces and the circuit wiring pattern 334k are joined together with solder.

In this embodiment, the upper arm circuit 151 includes two circuit portions connected in parallel, with each of these circuit portions including an IGBT 328 and a diode 156 connected in parallel. How many of these circuits are to be connected in parallel is determined by the flow rate of current that is to be supplied to the motor 192. For example, if a larger current than flows to the motor 192 according to this embodiment is required, then the structure may incorporate three of these circuit portions connected in parallel, or even more. Conversely, if it is possible to drive the motor with a small current, then each arm for each phase may only include one circuit portion. In a similar manner, the lower arm circuit 152 includes two circuit portions connected in parallel, with each of these circuit portions including an IGBT 330 and a diode 166 connected in parallel. The AC terminal 159V for outputting AC power is provided to the lower arm circuit 152.

In FIG. 6, 314a and 316a are terminal portions of the DC positive terminal 314 and the DC negative terminal 316, and these are provided upon the upper surface of the power module case 302. It should be understood that the DC positive terminal 314 and the DC negative terminal 316 are arranged as vertically overlapped, and insulating paper 318 is provided between them. The AC terminals 159 (159U, 159V, and 159W) of the upper and lower arm series circuits 150 (150U, 150V, and 150W) are arranged in parallel along one edge of the rectangular frame of the power module case 302. As shown in FIG. 8, in the lower arm circuit 151 and the upper arm circuit 152, the arrangement of the elements is symmetric with respect to the terminals 314 and 316. Due to this, the control terminals (i.e. the gate terminals) 320LU through 320LW of the lower arm circuits of the various phases are provided upon the frame portion on the same side as the AC terminals 159, and the control terminals (i.e. the gate terminals) 320UU through 320UW of the lower arm circuits for the various phases are provided upon the frame portion on the opposite side. Resin or silicon gel (not shown in the figures) is charged into the semiconductor module portion that is surrounded by the power module case 302, so that the semiconductor elements and the wiring provided within the semiconductor module portion are protected.

As shown in FIG. 7, the fins 305 are formed upon the lower surface of the metallic base 304, but it would also be acceptable to attach the fins 305 to the metallic base 304 by brazing or soldering, or to form the metallic base 304 and the fins 305 integrally by forging. By forming the metallic base 304 and the fins 305 integrally by forging, along with enhancing the productivity of the power module 300, it is also possible to enhance the thermal conductivity from the metallic base 304 to the fins 305, thus enhancing the heat dissipation performance for the IGBTs and the diodes.

Moreover, by ensuring that the Vickers hardness of the metallic base 304 is 60 or greater, it is possible to suppress ratchet deformation of the metallic base 304 originating due to temperature cycling, and thereby it is possible to enhance the sealing performance between the metallic base 304 and the chassis 12.

Figure 9:
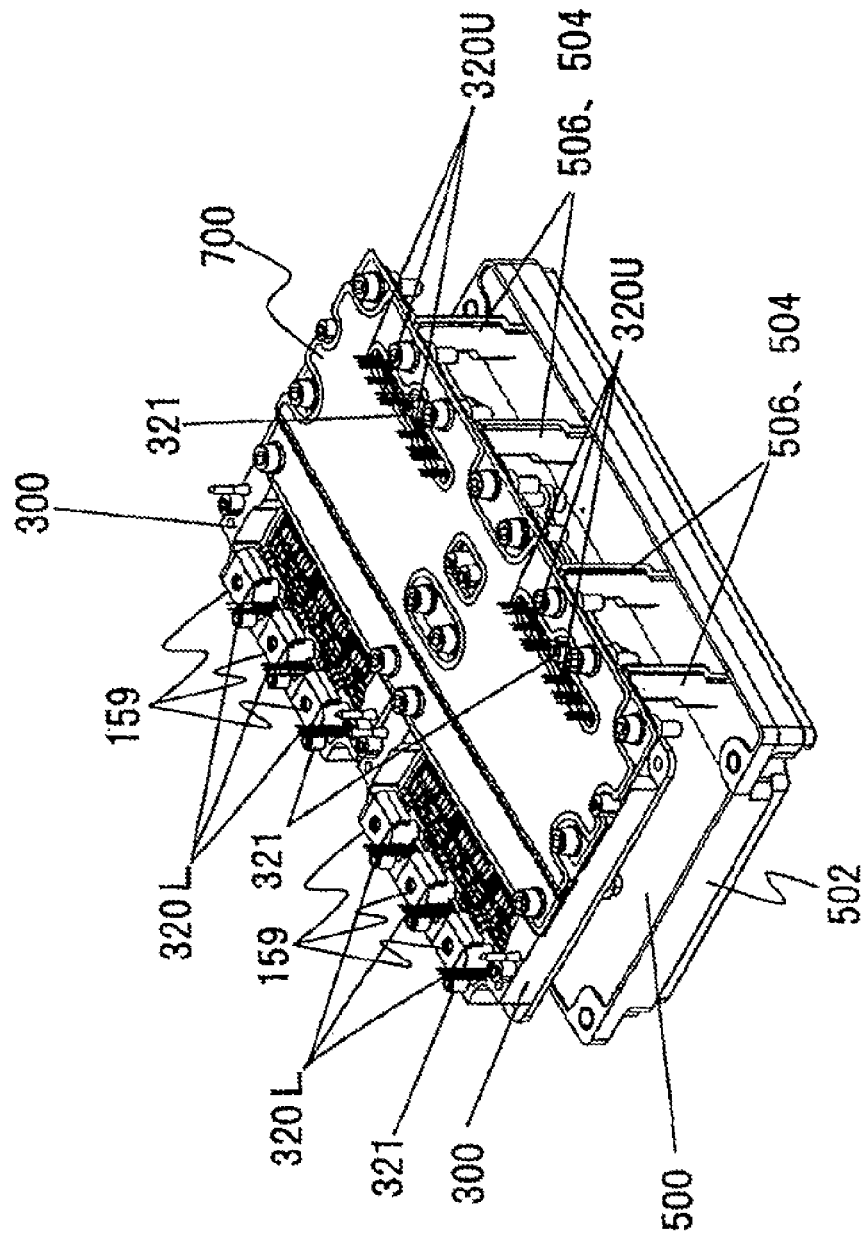
FIG. 9 is a figure showing a capacitor module, a DC side conductor board, and a power module in the assembled state.

FIG. 9 is a perspective view showing just the capacitor module 500, the DC side conductor board 700, and the two power modules 300 removed from the power conversion device 200 according to this embodiment. As shown in FIG. 9, the two power modules 300 are provided arranged side by side so that their AC terminals 159 all point in the same direction. The electrical connection portions between the two power modules 300 and the capacitor module 500 are provided on the opposite side from these AC terminals 159. This electrical connection between the two power modules 300 and the capacitor module 500 is performed by the laminated conductor board 700 upon the flat plate.

A large number of capacitor cells 514 (not shown in the figure) are housed within a capacitor case 502 that is fixed upon the lower casing portion 16. The positive electrode side capacitor terminal 504 and the negative electrode side capacitor terminal 506 of the capacitor module 500 are arranged along one side of the capacitor case 502. The laminated conductor board 700 that is connected to the power modules 300 is arranged so as to cover over the two power modules 300. The positive electrode side capacitor terminals 504 and the negative electrode side capacitor terminals 506 are formed in letter-L structures that are made so as to stand up from the plane of opening of the capacitor case 502. These positive electrode side capacitor terminal 504 and negative electrode side capacitor terminal 506 of letter-L structure are connected by bolts to the laminated conductor board 700.

This laminated conductor board 700 consists of a flat plate shaped positive electrode side conductor board and a flat plate shaped negative electrode side conductor board, and an insulating sheet sandwiched between these conductor boards. As a result, it is possible to anticipate reduction of the parasitic inductance from the power module 300 to the capacitor module 500. The plurality of upper arm control terminals 320U that extend upwards from the power modules 300 pass through apertures that are formed in the laminated conductor board 700 and project upwards.

Furthermore, as shown in FIG. 5, the drive circuit board 22 is disposed above the laminated conductor board 700. The laminated conductor board 700 has its negative electrode side conductor board on the side of the drive circuit board 22, and, on the other hand, has its positive electrode side conductor board on the side of the power modules 300. Due to this, the low voltage negative electrode conductor board and the insulating sheet are present between the positive electrode conductor board that is at a high voltage and the drive circuit board, so that it is possible to prevent the drive circuit board 22 from coming into contact with high voltage.

A number of bosses 321 for fixing the drive circuit board 22 are formed upon the upper surface of the power module case 302 (refer to FIGS. 6 and 9). Along with the drive circuit board 22 upon which the driver circuit 174 is implemented being fixed to these bosses 321, the upper arm control terminals 320U (320UU, 320UV, and 320UW) are passed through terminal hole portions that are formed in the drive circuit board 22. Thereafter, the terminal portions of the drive circuit board 22 and the arm control terminals 320U are joined together by being fixed with solder or by welding or the like. Since the bosses 321 are formed near the upper arm control terminals 320U, accordingly it is possible to enhance the anti-vibration performance during vehicle travelling.

Figure 10:
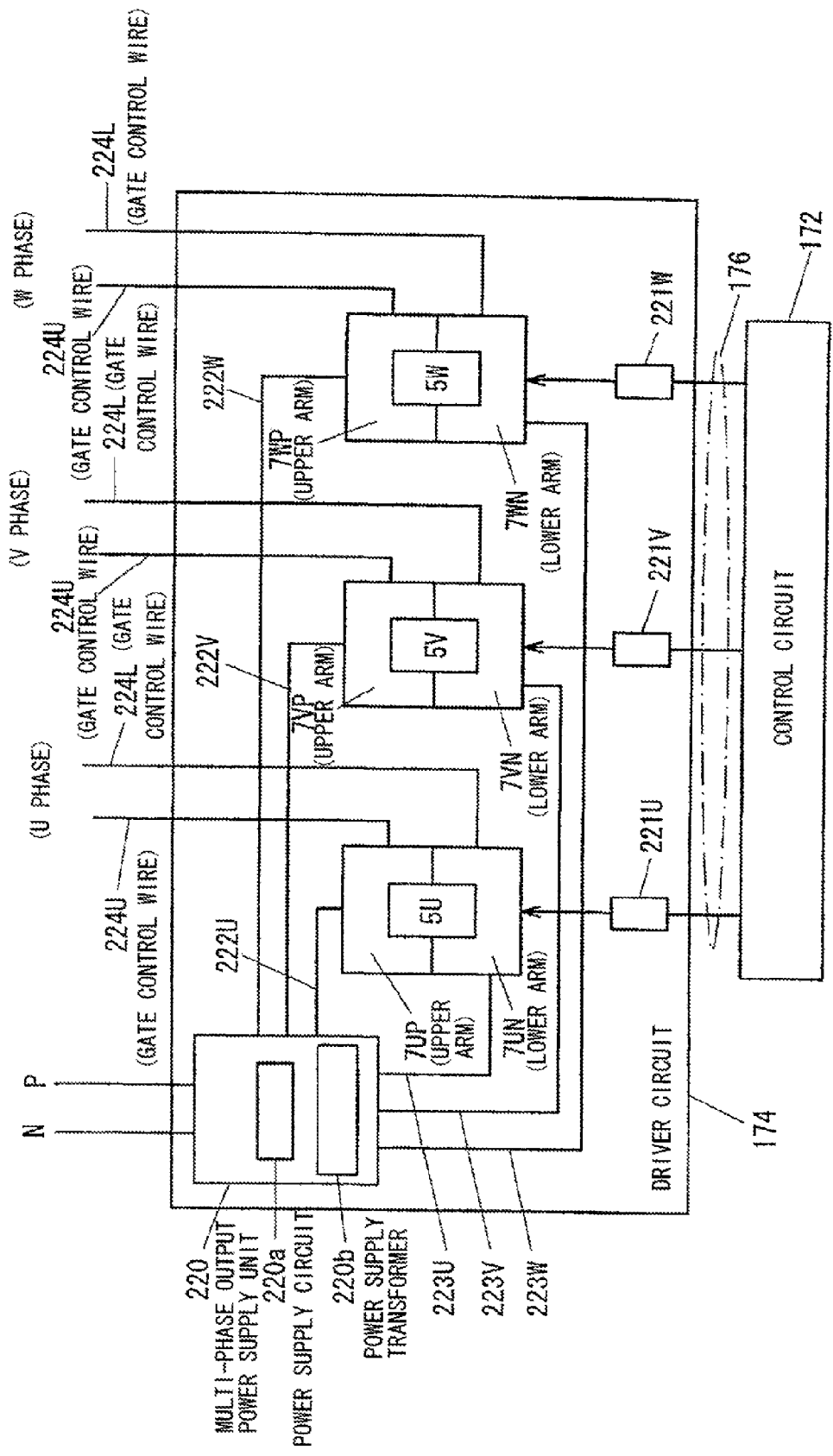
FIG. 10 is a block diagram showing the principal portions of a driver circuit.

Next, the details of the drive circuit board 22 will be explained. FIG. 10 is a block diagram showing the principal portions of the driver circuit 174 shown in FIG. 2. The components that make up this driver circuit 174 are implemented upon the drive circuit board 22. To the driver circuit 174 that drives the IGBTs 328 and 330, there are provided: pre-driver ICs 5U, 5V, and 5W that have protective functions such as a short circuit protective function, a low voltage protective function, and so on; upper arm drive circuit portions 7UP, 7VP, and 7WP; lower arm drive circuit portions 7UN, 7VN, and 7WN; photo-couplers 221U, 221V, and 221W that transmit signals while electrically insulating them; a multi-phase output power supply unit 220 that supplies insulated power to the drive circuit portions 7UP through 7WP and 7UN through 7WN; and so on. Control commands from the control circuit 172 are inputted to the pre-driver ICs 5U, 5V, and 5W via the photo-couplers 221U through 221W. The pre-driver IC 5U is a pre-driver IC of the half bridge type, and is connected to the upper arm drive circuit portion 7UP and the lower arm drive circuit 7UN that constitute the peripheral circuitry of this pre-driver IC 5U. On the basis of control commands from the control circuit 172, the pre-driver IC 5U performs switching control of the power semiconductor element IGBTs 328 and 330 of the upper and lower arms with the drive circuit portions 7UP and 7UN for the upper and lower arms. In a similar manner, the IC 5V and the IC 5W are pre-driver ICs related to the V phase and the W phase.

The multi-phase output power supply unit 220 includes a power supply circuit 220a and a power supply transformer 220b that will be described hereinafter. This power supply unit 220 is connected to the N line and the P line of the battery. The battery voltage is converted to a predetermined constant voltage (for example a voltage of 15 V) by the power supply transformed 220B, and this insulated power supply voltage is supplied to the drive circuit portions 7UP through 7WP of the upper and lower arms via the power supply wiring 222U through 222W and 223U through 223W.

The potential of the gate control wiring 224U that is connected to the gate electrode terminal 154 (refer to FIG. 2) of IGBT 328 on the upper arm side (refer to FIG. 2) of the driver circuit 174 is the same potential as that of the output line of the power module 300. Because of this, due to the ON and OFF switching by the IGBT 328 being repeated, the potential of the driver circuit 174 goes up and down between the potential of the P line (if the voltage of the battery 136 is 400 V, a potential of 400 V) and the potential of the N line (zero volts). On the other hand, while the potential of the gate control wiring 224L that is connected to the gate electrode terminal 164 (refer to FIG. 2) of the IGBT 330 (refer to FIG. 2) on the lower arm side is the same potential as that of the N line, and fundamentally is zero volts, it sometimes changes by around several tents of volts due to voltage drop when current is flowing.

Since the battery power supply lines (N and P) and the power supply wiring 222U through 222W and 223U through 223W are mutually insulated by the power supply transformer 220b, the potential level of the power supply wiring 222U through 222W that is connected to the upper arm drive circuit portions 7UP through 7WP is the same as the potential of the output line, in a similar manner to the case of the gate control wiring 224U. On the other hand, the power supply wiring 223U through 223W that is connected to the lower arm drive circuit portions 7UN through 7WN is the same as the potential of the N line. Thus, when control signals are inputted from the control circuit 172 of the low voltage system to the upper and lower arm drive circuit portions of this type of high voltage system, those signals are inputted via the photo-couplers 221U through 221W that transmit signals while providing electrical insulation thereof.

Figure 11:
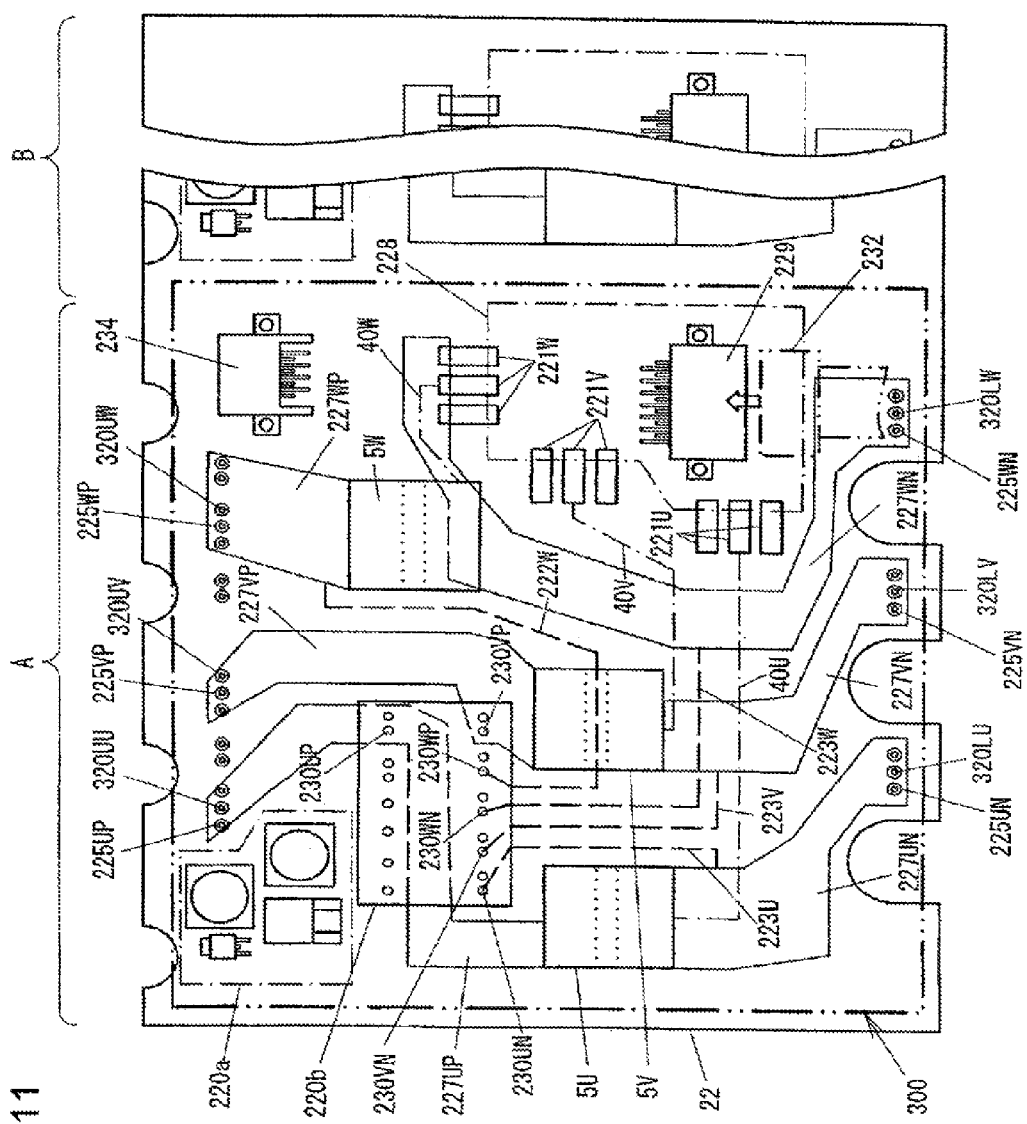
FIG. 11 is a figure showing the arrangement of a circuit and wiring upon a drive circuit board.

FIG. 11 is a figure showing the arrangement of the circuitry and wiring upon the drive circuit board 22. FIG. 11 is a plan view showing the drive circuit board 22 as seen from the side of the control circuit board 20, and is a figure showing a portion (the area that is designated by the reference symbol A) that corresponds to one of the two power modules 300. It should be understood that the portion that corresponds to the other power module 300 (the area that is designated by the reference symbol B) has the same structure, and accordingly it is not shown in the figure. In the following, the layout structure of this drive circuit board 22 will be explained by taking the portion designated by the reference symbol A as an example. It should be understood that a multi-layered board is used as the base board for the drive circuit board 22, and, in this embodiment, a multi-layered board of four layer construction is used, that has four conductor layers.

In FIG. 11, the regions designated by the reference symbols 227UP, 227VP, and 227WP show the regions in which the respective upper arm drive circuit portions 7UP, 7VP, and 7WP are implemented, and, along with circuit patterns being formed in these regions, circuit components are also mounted thereupon. On the other hand, the regions designated by the reference symbols 227UN, 227VN, and 227WN show the regions in which the respective lower arm drive circuit portions 7UN, 7VN, and 7WN are implemented. The upper arm implementation region 227UP and the lower arm implementation region 227UN are arranged in the vertical direction as seen in the figure, with a gap being left between them for insulation. The pre-driver IC 5U is provided in this gap region, so as to straddle the upper arm implementation region 227UP and the lower arm implementation region 227UN. In a similar manner, the pre-driver IC 5V is provided between the upper arm implementation region 227VP and the lower arm implementation region 227VN, and the pre-driver IC 5W is provided between the upper arm implementation region 227WP and the lower arm implementation region 227WN.

As shown in FIG. 4, the corresponding power module 300 as shown by the double dotted broken lines is disposed within the chassis 12 below the drive circuit board 22. The region of the power module 300 in which the IGBTs 328 and the diodes 156 for the upper arms (refer to FIG. 8) are implemented corresponds to the region higher than the center of the drive circuit board 22 shown in FIG. 11. On the other hand, the region in which the IGBTs 330 and the diodes 166 for the lower arms (refer to FIG. 8) are implemented corresponds to the region lower than the center of the drive circuit board 22. Due to this, the upper arm control terminals 320UU through 320UW shown in FIG. 6 are positioned at the upper side board edge portion as seen in the figure of the drive circuit board 22, while the lower arm control terminals 320LU through 320LW are positioned at the lower side board edge portion of the drive circuit board 22.

The terminal portions 225UP, 225VP, and 225WP are provided at the upper edge portions as seen in the figure of the upper arm implementation regions 227UP, 227W, and 227WP, in other words at the upper edge portion of the board. And the upper arm control terminals 320UU through 320UW for each of the phases are connected to these terminal portions 225UP through 225WP. Each of the upper arm control terminals 320UU through 320UW passes through the drive circuit board 22 from its rear surface side to its front surface side at the terminal portions 225UP through 225WP, and is joined thereto by fixing with solder or by welding or the like.

Moreover the terminal portions 225UN, 225VN, and 225WN, to which the lower arm control terminals 320LU through 320LW for the various phases are connected, are provided at the lower edge portions as seen in the figure of the lower arm implementation regions 227UN, 227VN, and 227WN, in other words at the lower edge portion of the board. And each of the lower arm control terminals 320LU through 320LW passes through the drive circuit board 22 from its rear surface side to its front surface side at the terminal portions 225UN through 225WN, and is joined thereto by fixing with solder or by welding or the like.

Components that make up the power supply circuit 220a of the multi-phase output power supply unit 220 of FIG. 10 are mounted in the region at the upper left corner of the drive circuit board 22, adjacent to the upper arm implementation region 227UP. And power supply cables from the P line and the N line are connected to the power supply connector 234. The power supply transformer 220b is mounted so as to overlap portions of the upper arm implementation regions 227UP and 227W. 230UP through 230WN are the output terminals of the power supply transformer 220b.

While in FIG. 10 the power supply wiring 222U and 222V for connection between the multi-phase output power supply unit 220 and the upper arm drive circuit portions 7UP and VP is shown, since in FIG. 11 the power supply transformer 220b is mounted so as to overlap the upper arm implementation regions 227UP and 227VP, accordingly the output terminals 230UP and 230VP are directly connected to the upper arm drive circuit portions 7UP and 7VP. Due to this, the power supply wiring 222U and 222V may be omitted. The other output terminals 230WP, 230UN, 230VN, and 230WN are connected to the upper and lower arm drive circuit portions 7WP and 7UN through 7WN that are disposed in the upper and lower arm implementation regions 227WP and 227UN through 227WN, via the power supply wiring 222W and 223U through 223W.

The region designated by the reference symbol 228 is a low voltage pattern region, and is a region in which components and a circuit pattern of a low voltage system are disposed. The regions other than this low voltage pattern region 228 are high voltage system regions that are at the same potential level as the battery voltage. The control signals from the control circuit board 20 shown in FIG. 4 are inputted to a signal connector 229 that is provided in the low voltage pattern region 228. A connector 232 of a signal cable is removably fitted to this signal connector 229, as shown by the double dotted broken lines. The plurality of photo-couplers 221U through 221W are provided at the edge portion of the low voltage pattern region 228. While a wiring pattern is formed in this low voltage pattern region 228 from the connector 229 to the photo-couplers 221U through 221W, this is omitted from the figure.

As previously described, the photo-coupler 221U is a photo-coupler for transmitting a control signal to the U phase, and, in a similar manner, the photo-couplers 221V and 221W are photo-couplers for transmitting control signals to the V phase and the W phase respectively. And the broken lines 40U, 40V, and 40W are signal wiring for transmitting control signals from the photo-couplers 221U, 221V, and 221W to the corresponding pre-driver ICs 5U, 5V, and 5W.

For example, when driving the IGBT 328 for the upper arm of the U phase, a control signal from the control circuit 172 (refer to FIGS. 2 and 10) is inputted to the lower arm side in the pre-driver IC 5U via the signal connector 229→the low voltage pattern→the photo-coupler 221U→the signal wiring 40U. A level shift circuit that converts the voltage of this control signal to the voltage level of the upper arm side drive circuit 7UP is housed within the pre-driver IC 5U, and the IGBT 328 for the upper arm is driven by the upper arm side drive circuit 7UP on the basis of the control signal after it has been level shifted. On the other hand, when driving the IGBT 330 for the lower arm, the control signal is inputted to the lower arm side in the pre-driver IC 5U in a similar manner, via the signal connector 229→the low voltage pattern→the photo-coupler 221U→the signal wiring 40U. And thus the IGBT 330 for the lower arm is driven by the lower arm side drive circuit 7UN.

Figure 12:
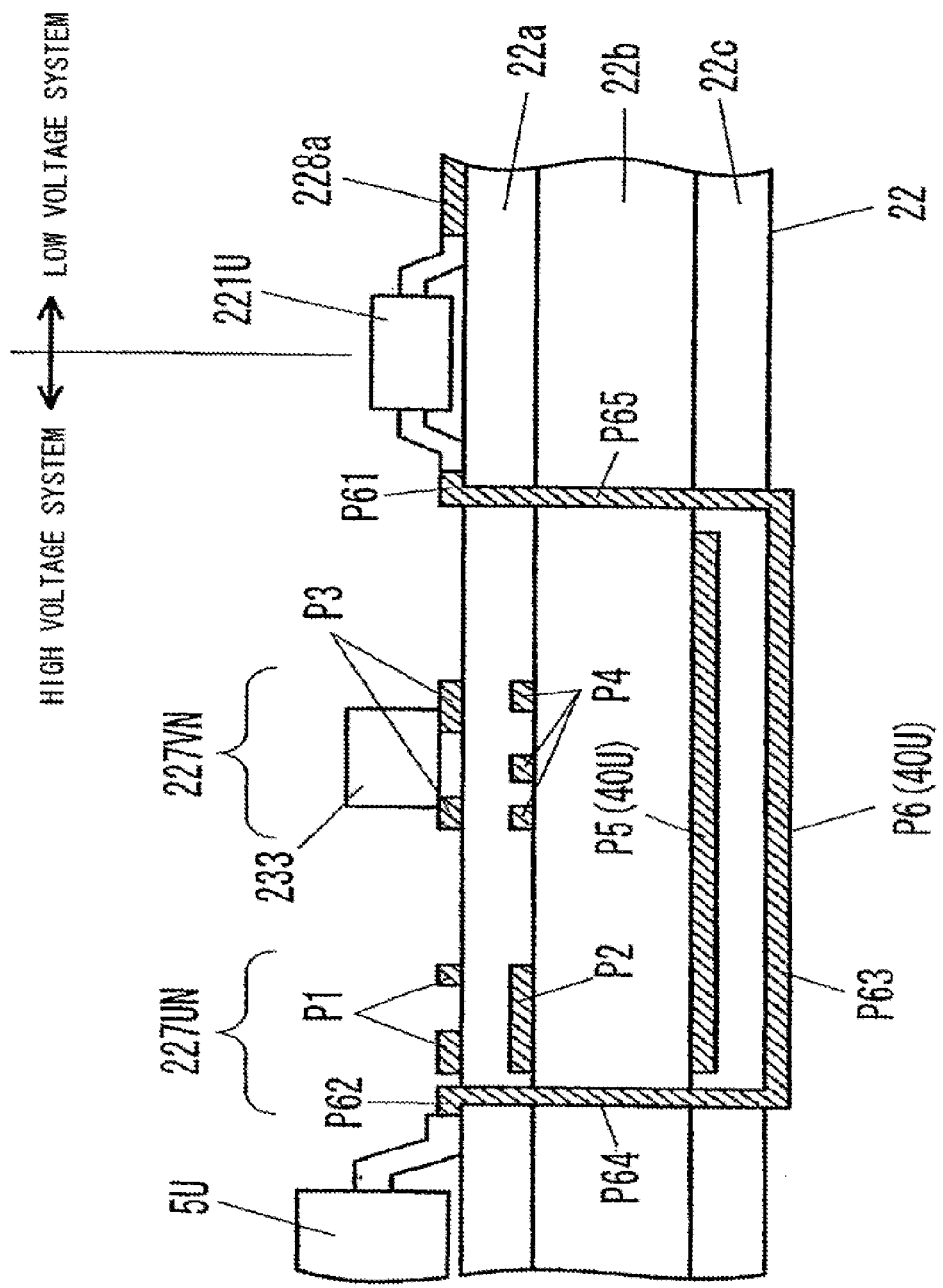
FIG. 12 is a schematic figure showing a cross section of this drive circuit board.

FIG. 12 is a figure that schematically shows a cross section of the drive circuit board 22, and is a figure for explanation of the signal wiring 40U from the photo-couplers 221U to the pre-driver IC 5U. It should be understood that, since the cross section of the lower arm implementation region 227WN is the same as that of the lower arm implementation region 227VN, it is omitted from FIG. 12. The drive circuit board 22 is a glass and epoxy board of multi layered construction in which insulation masses 22a through 22c and conductor layers (copper patterns) are alternatingly superimposed, and has four such conductor layers.

In FIG. 12, P1 and P3 are patterns on the first layer, P2 and P4 are patterns on the second layer, and P5 is a pattern on the third layer. Furthermore, the pattern P6 is made up of a pattern P61 on the first layer that is connected to the high voltage side terminal of the photo-coupler 221U, a pattern P62 on the first layer that is connected to the lower arm side terminal of the pre-driver circuit 5U, a pattern P63 on the fourth layer that is formed upon the rear surface side of the board, and through patterns P64 and P65 that pass through the drive circuit board 22 and connect the patterns on the first layer and the pattern on the fourth layer.

Among the patterns P1 through P4 on the first and second layers, the patterns P1 and P2 are formed upon the implementation region 227UN for the lower arm of the U phase, while the patterns P3 and P4 are formed upon the implementation region 227VN for the lower arm of the V phase. Furthermore, the patterns P5 and P6 constitute the signal wiring 40U, while the pattern P5 on the third layer is a header pattern that functions as a ground pattern. The ground terminals of the photo-coupler 221U and the pre-driver IC 5U are connected to this ground pattern P5. And 233 is a circuit component that is provided in the implementation region 227VN for the lower arm.

As shown in FIG. 12, in this embodiment, the signal wiring 40U that connects together the photo-coupler 221U and the pre-driver IC 5U is provided on the third and fourth layers of the drive circuit board 22, so as to detour round below the first and second layers upon which the circuit pattern for the drive circuit 7VN of the lower arm of the V phase is formed. As a result, the freedom for laying out the photo-couplers and the signal wiring is increased, and it is possible to make the potentials between the lower arms independent. Furthermore, by passing the signal wiring upon the third and fourth layers, it is possible to reduce the influence of noise due to fluctuations of the potentials of the lower arms. Here, in order to reduce the influence of electromagnetic noise as much as possible, it is arranged to detour, not under the upper arm whose voltage fluctuations with respect to the potential of the P line and the potential of the N line are large, but rather under the lower arm whose voltage fluctuations are small. It should be understood that, while it appears in the plan view shown in FIG. 11 that the signal wiring 40U for the U phase and the implementation region 227VN for the lower arm of the V phase are mutually overlapped, actually, as shown in FIG. 12, these are separated in the thickness direction of the board on the first and second layers, and on the third and fourth layers, so that the U phase and the V phase are separated.

In the same way in relation to the signal wiring 40V that connects the photo-coupler 221V and the pre-driver IC 5V of the V phase, the signal wiring 40V is provided on the third and fourth layers of the drive circuit board 22. On the other hand, the photo-coupler 221W is arranged to straddle over the low voltage system region 228 and the lower arm implementation region 227WN, while the signal wiring 40W of the lower arm implementation region 227WN is formed upon the first and second layers.

It should be understood that while, in this embodiment, the phases are separated between the second and third layers, the reason for this is that generally, in the structure of a four-layer board, in comparison with the distance between the first and second layers and the distance between the third and fourth layers, the distance between the second and third layers is around three times as great. Furthermore, while a four-layer board is used in this embodiment, even with a multi-layered board having six or more layers, it is desirable to separate the phases between layers whose inter-layer distance is great.

Figure 13:
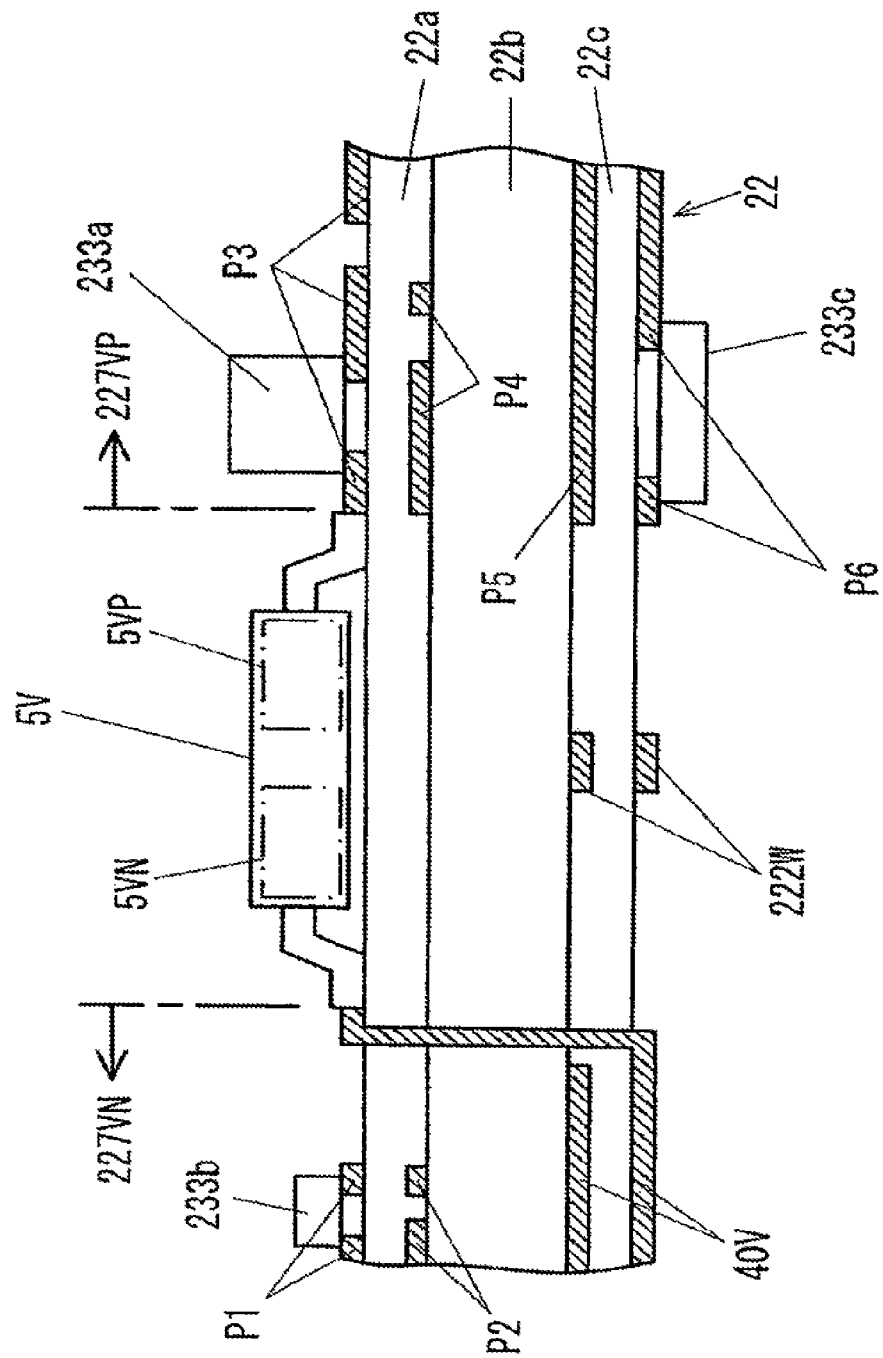
FIG. 13 is a sectional view showing a power supply wiring portion of the drive circuit board.

Next, the power supply wiring 222U through 222W and 223U through 223W that connects the output terminals of the power supply transformer 220b to the upper and lower arm drive circuits will be explained. FIG. 13 is a figure for explanation of the power supply wiring 222W that is disposed under the pre-driver IC 5V, and is a cross section in the vertical direction as seen in the figure through a portion of the pre-driver IC 5V in FIG. 11.

The patterns P1 and P2 denote circuit patterns of the region 227VW for implementation of the lower arm, and the patterns P3 through P6 denote circuit patterns of the region 227VP for implementation of the upper arm. 233b is a circuit component of the lower arm drive circuit portion 7VN, that is implemented upon the front surface side of the board 22 by utilizing the patterns P1 and P2 on the second layer. Furthermore, 233a and 233c are circuit components of the upper arm drive circuit portion 7VP that is implemented in the upper arm implementation region 227VP. The circuit component 233a is implemented upon the front surface side of the board 22 by utilizing the patterns P3 and P4 on the first and second layers. And the circuit component 233c is implemented upon the rear surface side of the board 22 by utilizing the patterns P5 and P6 on the third and fourth layers. Some of the circuit components are implemented on the rear surface of the board as well in this way.

The pre-driver IC 5V is mounted between the upper and lower arm implementation regions 227VN and 227VP, and the signal wiring 40V described above is connected to its lower arm side terminal. Nothing is disposed directly below the pre-driver IC 5V, so that the upper and lower arm implementation regions 227VN and 227VP are separated by at least a predetermined insulation distance. As described above, the signal wiring 40V is provided upon the fourth layer, and is pierced through from the third and fourth layers to the first and second layers in the lower arm implementation region 227VN, so as to be connected to the pre-driver IC 5V. The interior of the pre-driver IC 5V is divided into an upper arm side block 5W and a lower arm side block 5VN. The power supply wiring 222W that transmits power supply voltage from the power supply transformer 220b to the upper arm drive circuit portion 7WP in the upper arm implementation region 227WP is laid out so as to pass through underneath the pre-driver IC 5V. This power supply wiring 222W is made as two wiring patterns, one for the plus side and one for the minus side, and is formed in the third and fourth layers.

Figure 14:
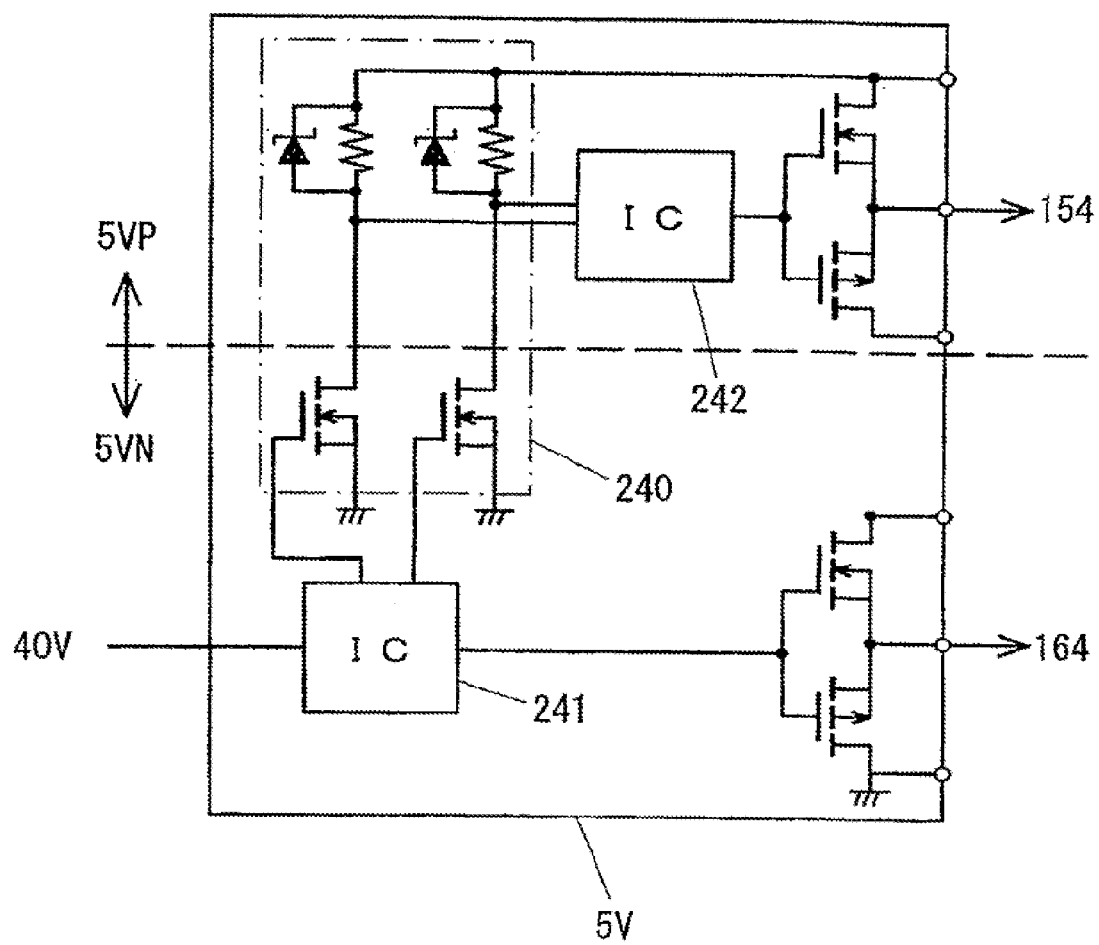
FIG. 14 is a circuit diagram showing the general structure of a pre-driver IC.

FIG. 14 is a circuit diagram showing the general structure of the pre-driver IC 5V. In FIG. 14, the side below the broken line corresponds to the block VN, while the side above the broken line corresponds to the block 5VP. An IC 241 for the lower arm and a drive circuit that consists of an n MOSFET and a p MOSFET are provided in the block 5VN. In a similar manner, an IC 242 for the upper arm and a drive circuit that consists of an n MOSFET and a p MOSFET are provided in the block 5VP. In the pre-driver IC 5V, these circuits are housed within a single package.

The IC 241 for the lower arm controls the drive circuit on the lower arm side, on the basis of a lower arm control signal. On the other hand, a control signal for the upper arm that is inputted to the pre-driver IC 5V is inputted from the IC 241 for the lower arm to the level shift circuit 240, and the reference potential of this control signal is shifted by this level shift circuit 240 to the reference potential level of the upper arm. And the IC 242 for the upper arm controls the drive circuit on the upper arm side on the basis of this control signal that has been level shifted.

In order to ensure insulation between the circuitry of the block 5VN and the circuitry of the block 5VP, in other words in order to ensure the insulation performance between the upper and the lower arms (for example, an insulation withstand voltage of 1200 V), a predetermined space (i.e. an insulating region) is kept empty within the interior of the package of the pre-driver IC 5V, with the blocks 5VN and 5VP being centered around the broken line portion (almost in the center of the package). Accordingly, if this is a pre-driver IC in which ball grid array terminals are formed on the rear surface of the package, then these ball grid array terminals are formed more to the outside (i.e. to the lower arm side and the upper arm side) than this band shaped insulating region that includes the broken line portion. The power supply wiring 222W that is at the potential of the upper arm is laid out so as to pass through the lower layers of this band shaped insulation region (in FIG. 13, the third and fourth layers). Any of the second through the fourth layers may be passed through as desired; and also it would be acceptable to form a plurality of wiring patterns in the same layer of the pre-driver IC 5V, provided that there is sufficient space in the lower layer. Furthermore, it would also be acceptable to pass under the pre-driver IC 5V, not the power supply wiring for the upper arm but rather the power supply wiring for the lower arm. In this case, since the potential difference of the lower arm is lower, in the case of the lower arm side, it would also be possible to form the pattern on the first layer.

Since, as shown in FIG. 13, no circuit pattern or components for the V phase are disposed on the lower side of the pre-driver IC 5V, accordingly, by forming the power supply wiring 222W for the W phase in this region, it becomes possible to make the wiring to the region 227WP for implementation of the upper arm of the W phase comparatively short in length, while still ensuring good insulation between the upper and lower arms of the V phase, that are different phases. Furthermore, by passing the power supply wiring 222W to the third and fourth layer that are below the band shaped insulating region that includes the broken line portion, it is kept as far as possible from the blocks 5VN and 5VP of the pre-driver IC 5V, and thereby it is arranged to reduce the influence of electromagnetic waves that originate in fluctuations of the potential of the upper arm during switching.

On the other hand, with regard to the power supply wiring 223W for the lower arm, it is drawn out to the W phase side through the lower layer 227VN for implementation of the lower arm that is at the same potential level, and is connected to the region 227WN for implementation of the lower arm. In this case, in order to suppress influence between the phases, it is desirable to utilize the layer on the lower side as much as possible. As a point that must be considered in relation to the power supply wiring, with regard to the power supply wiring for the upper arm that is at the same potential level as the upper arm, it is arranged for this wiring to pass through the lower layer of the pre-driver IC, rather than passing through the lower layers of the implementation regions for the upper and lower arms. Moreover, with regard to the power supply wiring for the lower arm, it is arranged for this wiring to pass through the lower layer of the lower arm implementation region that is at the same potential level, rather than passing through the lower layer of the upper arm implementation region.

It should be understood that, when the wiring and the implementation regions are laid out, they are arranged so as to maintain predetermined insulating distances between them. For example, while it is necessary to ensure the same order of insulating distance (for example 3 mm) between the regions that are at P electrical potential and the regions that are at output potential, between the output power regions and the regions that are at output potential, between the regions that are at N potential and the regions that are at P potential, and between the regions that are at N potential and the regions that are at output potential, it is however necessary to ensure a greater insulating distance (for example 5 mm) between the low voltage region and the regions that are at P potential.

As has been explained above, in this embodiment, the point is to try to make the drive circuit board 22 more compact while keeping the noise low. As shown in FIG. 6, in the power module 300 that is disposed at the lower side of the drive circuit board 22, the control terminals 320LU through 320LW and 320UU through 320UW that are connected to the circuit board 22 are arranged at a portion of the frame that is outside the power module case 302. In the prior art a layout has generally been adopted in which, by arranging the photo-couplers in a region that is outboard of the control terminals, it is arranged for the signal lines not to intersect the upper and lower arm implementation regions. However, since the photo-couplers are arranged in a region that is outboard of the control terminals, accordingly the drive circuit board 22 becomes large, and this involves the shortcoming that the power conversion device itself becomes undesirably increased in size.

Thus, in this embodiment, the low voltage system is arranged in the region between the lower arm control terminals 320LU through 320LW and the upper arm control terminals 320UU through 320UW. In this case, as shown in FIG. 11, the low voltage system region is gathered together into a single region (the low voltage pattern region 228), and it is arranged to keep this low voltage system region at an appropriate distance from the upper arm implementation region that is at high potential level.

Furthermore, pre-driver ICs 5U through 5W of the half-bridge type are employed, in order to anticipate making the drive circuit board 22 more compact, and with the objective not only of reducing the number of driver ICs, but also of reducing the control signal wiring. If, as in the prior art, driver ICs are used for each of the upper and lower arms, then photo-couplers are required for each of the upper and lower arms. On the other hand, since the level shift circuit 240 is provided to the pre-driver IC 5V and shifts the reference potential level of the control signal to the level of the upper arm, accordingly it is possible to manage with one photo-coupler for signal insulation for each phase. As a result, along with it being possible to reduce the space for disposing the photo-couplers and the space for leading the signal wiring, and to increase the freedom of the layout, also it is possible to anticipate making the drive circuit board 22 more compact.

However, when the pre-driver ICs 5U through 5W are used, and the low voltage system region is disposed in the region between the control terminals as in FIG. 11, then it becomes difficult to lay out the signal wiring to each phase from the photo-couplers 221U through 221W that are provided peripherally to the low voltage pattern region 228. While, in the prior art, it was once necessary to lay out the signal wiring on the outside of the region between the control terminals, so as to be removed from the influence of the upper arm implementation region that is at output potential level, and to set the space between the upper arm implementation region large and to arrange the signal wiring therein, by contrast, in this embodiment, it is arranged to employ a wiring construction in which this type of structure is not required. In other words, it is arranged for it to be possible to pass the control signal lines linearly through the lower arm implementation region by laying out the signal wiring using a lower layer of the board 22 (for example the third and the fourth layer).

Furthermore, by disposing the power supply transformer 220b so as to overlap the upper arm implementation regions 227UP and 227VP, it is possible to omit the power supply wiring between it and the upper arm implementation regions 227UP and 227VP. Since this power supply wiring for the upper arm is at output potential level, it is difficult to make it cross regions for other phases. Due to this, the difficulty of the wiring is much alleviated by it being possible to omit the power supply wiring for the upper arms. Furthermore, by passing the power supply wiring 222W for the upper arm through the lower layer of the insulating region of the pre-driver IC 5V, the length of the wiring and the space that it requires are not made great, and it becomes simple and easy to connect the power supply wiring 222W to the upper arm implementation region 227 WP. It should be understood that while, in the example shown in FIG. 11, the power supply transformer 220b is disposed so as to overlap over the upper arm implementation regions 227UP and 227VP, it would also be acceptable to arrange it so as to overlap over the lower arm implementation regions.

Figure 17:
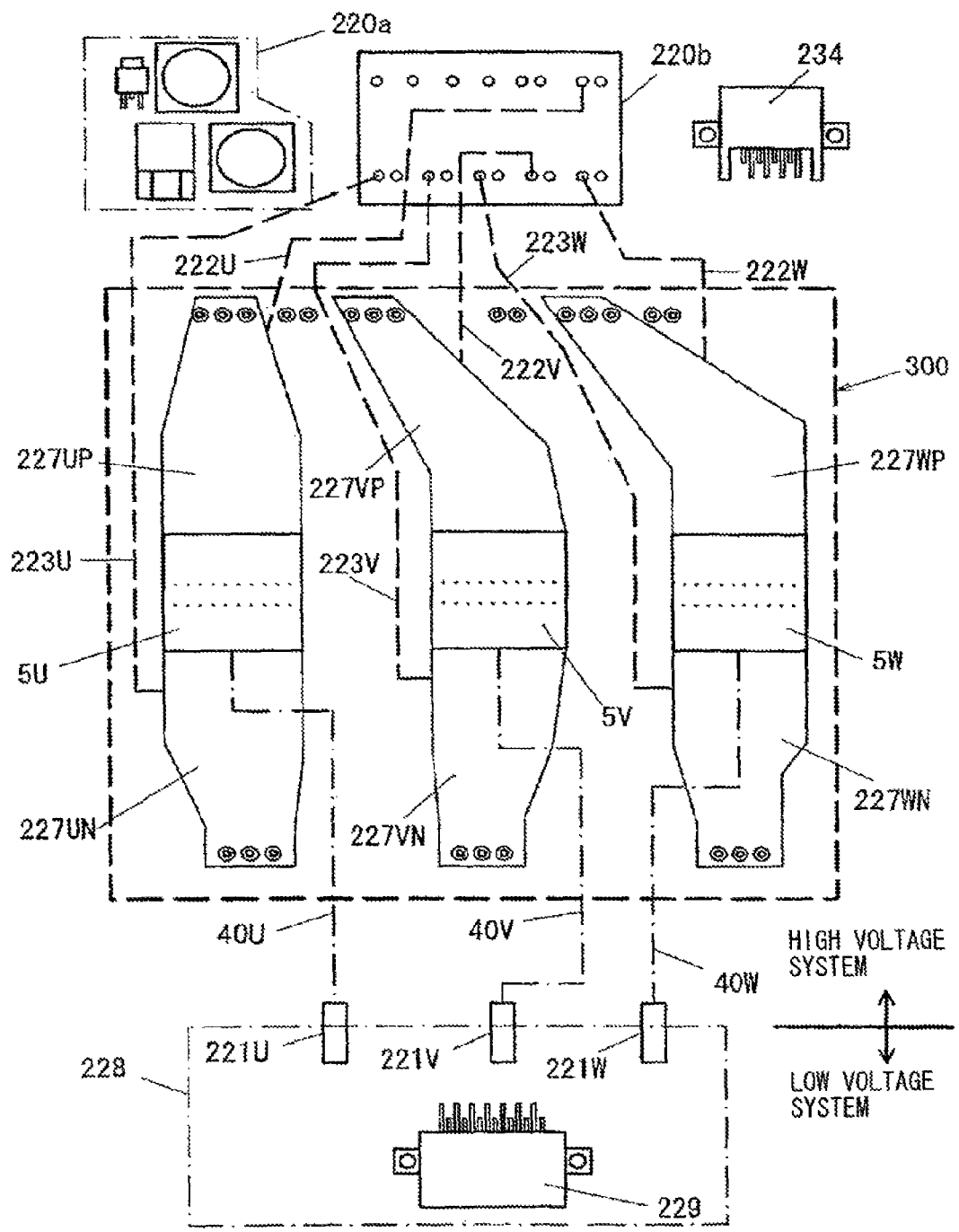
FIG. 17 is a figure showing an example of a case in which signal wiring and power supply wiring are laid out so as not to overlap with regions in which upper and lower arms are implemented.

FIG. 17 is a figure showing an example of a layout that is arranged so that the signal wiring and the power supply wiring do not overlap the implementation regions for the upper and lower arms. It should be understood that, in FIG. 17, a case is shown in which pre-driver ICs 5U, 5V, and 5W are used, just as in the case of the embodiment described above. In order to ensure that the wiring in the upper and lower arm implementation regions does not overlap, as shown in FIG. 17, the way in which the low voltage system and the power supply transformer 220b are arranged on the outside of the region between the control terminals is most simple. In FIG. 17, the low voltage system is arranged at the lower side as seen in the figure of the region between the control terminals, while the power supply transformer 220b and the power supply circuit 220a, that are the high voltage system, are arranged in the exterior region on the opposite side.

When the system is arranged as shown in FIG. 17, it is simple and easy to lay out the wiring while ensuring good insulation performance, but the drive circuit board 22 is undesirably increased in size. Due to this, with this embodiment, by employing a wiring structure like that described above, it is anticipated that it will be possible to make the board more compact, while still expecting good anti-noise countermeasures, so that it will be possible to arrange the low voltage system and the power supply system within the region between the control terminals.

<A Variant Embodiment>

Figure 15:
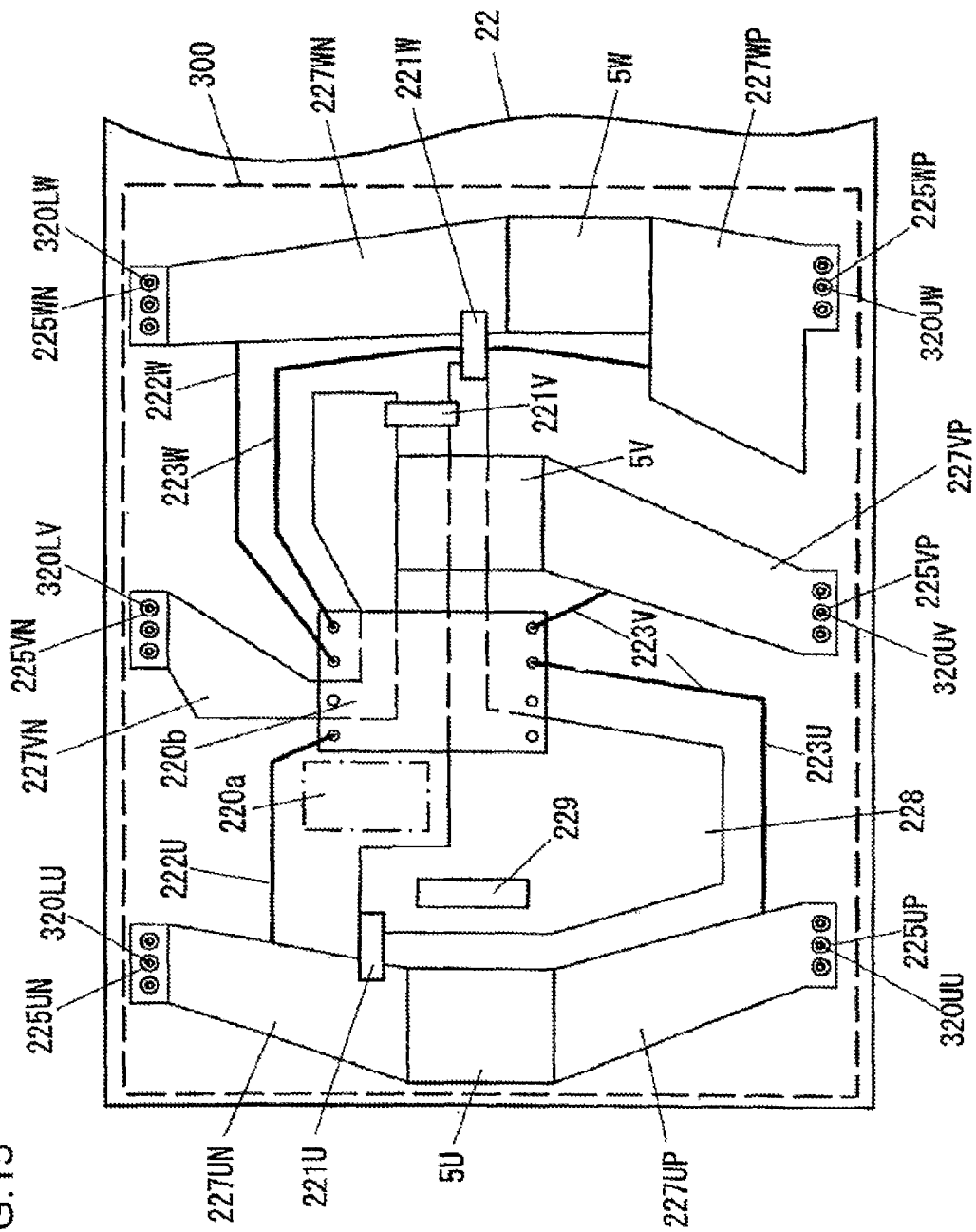
FIG. 15 is a figure showing a variant embodiment.

FIG. 15 is a figure showing a variant of the embodiment described above. It should be understood that FIG. 15 is a figure for explanation of the layout of the circuit components, and, along with some of the circuit components in FIG. 11 being only shown in schematic form, some components are not shown at all in that figure. In this variant embodiment, along with the multi-phase output power supply unit (the power supply circuit 220a and the power supply transformer 220b) being mounted near the center of the drive circuit board 22, the low voltage pattern region 228 is also disposed in that central portion. By employing this type of layout, it is possible to anticipate making the drive circuit board 22 more compact. And, in order to implement this type of layout, a structure like the one described below is employed.

By disposing a portion of the region 227VP for implementation of the upper arm for the V phase below the power supply transformer 220b, it is possible to omit the power supply wiring 222V. Furthermore. With regard to the power supply wiring 223W, it is laid out so as to detour around the low voltage pattern region 228, and, in a similar manner to the case of the power supply wiring 222W in FIG. 13, it is arranged to pass it through a layer below the photo-coupler 221W (the second, third, or the fourth layer) and to connect it to the lower arm implementation region 227WN. By doing this, it is arranged to suppress the influence upon the control signals as much as possible.

Figure 16:
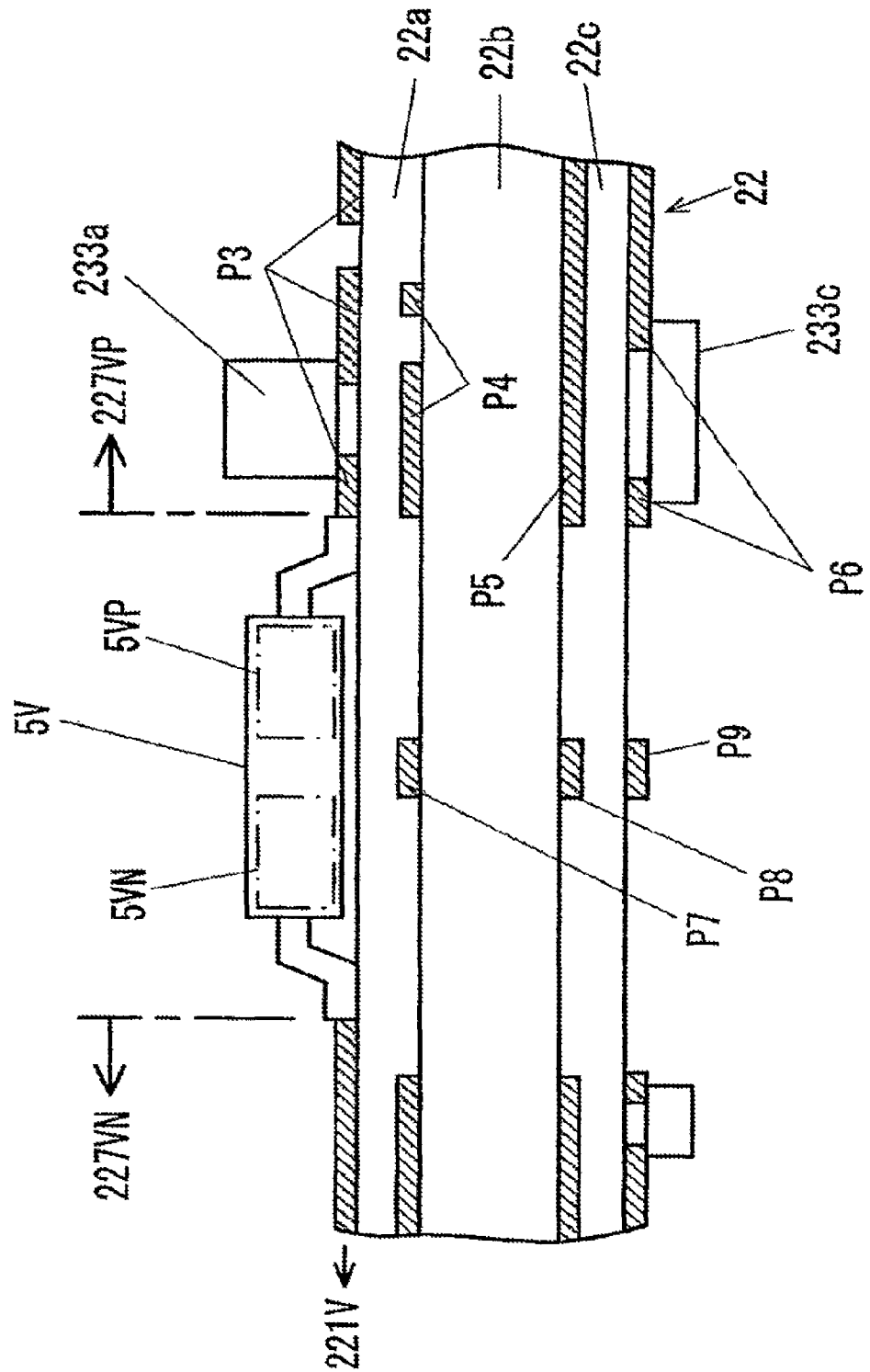
FIG. 16 is a sectional view of a portion of a pre-driver IC of a variant embodiment.

FIG. 16 is a sectional view of the portion with the pre-driver IC 5V The patterns P7 through P9 for the control signals are formed in the second layer through the fourth layer of the drive circuit board 22, so as to pass underneath the pre-driver IC 5V. And, as shown in FIG. 15, these patterns P7 through P9 and the circuit patterns that are provided in the lower arm implementation regions 227VN and 227WN are connected by the photo-couplers 221V and 221W, so that the control signals are transmitted to the lower arm implementation regions 227VN and 227WN. For example, patterns P7 and P8 on the third and fourth layer may be used. It should be understood that, since the photo-couplers 221V and 221W are implemented upon the front surface of the board, accordingly, in a similar manner to the case shown in FIG. 12, the patterns are formed so as to pass through to the first layer from the third and fourth layers, thus being connected to the terminals of the photo-couplers 221V and 221W.

By utilizing this type of structure, it is possible to wire the control signal lines, that are at low voltage potential, all the way to these phases, while ensuring good performance for insulating them from the upper and lower arms that are at high voltage potential. Furthermore, by passing the low voltage pattern underneath the pre-driver IC through the second to the fourth layer, and thus keeping it at as great a distance as possible from the pre-driver IC 5V, it is possible to reduce the influence of electromagnetic waves originating in potential fluctuations of the upper arm during switching. Of course, if it is possible, it would also be acceptable to form the signal wiring in the pattern on the first layer.

Moreover, as shown in FIG. 15, by arranging the low voltage pattern region 228 in the central portion of the board, it becomes possible to provide an arrangement in which the high voltage sides of the photo-couplers 221V through 221W overlap the regions 227UN through 227WN for implementation of the lower arms.

With the embodiments explained above, the following beneficial operational effects may be obtained.

In this embodiment, the connection portions 225UP through 225WP, to which the upper arm control terminals 320UU through 320UW of the power module 300 are connected, are arranged at one edge portion of the drive circuit board 22. Furthermore, the connection portions 225UN through 225WN, to which the lower arm control terminals 320LU through 320LW of the power module 300 are connected, are arranged at the other edge portion of the drive circuit board 22. With this type of structure, the regions 227UP through 227WP in which the upper arms are implemented, the regions 227UN through 227WN in which the lower arms are implemented, and the low voltage pattern region 228 in which the photo-couplers 221U through 221W that transmit the control signals to the driver circuit while electrically insulating them are implemented, are formed in the board region that is located between these board edge portions.

(1) And, as shown in FIG. 12, it is arranged to form the signal wiring 40U that transmits the control signal from the photo-coupler 221U to the implementation region 227UN upon which the corresponding driver circuit is mounted, in the lower arm implementation region 227VN, in the conductor layers P5 and P6 that are lower than the conductor layers P3 and P4 in which the lower arm driver circuit is implemented. Due to this, by it becoming possible to lay out the signal wiring 40U so that it crosses the lower arm implementation region 227VN, it is possible to keep the potential between the lower arms independent, while enhancing the freedom for laying out the photo-couplers and the signal wiring. As a result, it is possible to reduce the size of the drive circuit board 22 (i.e. the dimensions of its external shape) to be approximately the same as that of the power module 300, so that it is possible to anticipate that the power conversion device may be made more compact. Moreover, by passing the signal wiring through the third and fourth layers, it is also possible to reduce the influence of noise due to fluctuations of the potentials of the lower arms.

(2) Furthermore, by arranging the power supply transformer 220b that supplies power supply voltage to the upper arm driver circuit and the lower arm driver circuit so as to overlap portions of the upper arm implementations regions 227UP and 227VP as shown in FIG. 11, it is possible to omit the power supply wiring between the power supply transformer 220b and the driver circuit, so that it is possible to anticipate making the drive circuit board 22 more compact.

(3) Moreover, by using the pre-driver ICs 5U through 5W as shown in FIG. 11, it is possible to reduce the photo-coupler and signal wiring, so that it is possible to anticipate making the drive circuit board 22 more compact. Yet further, by laying out the power supply wiring 222W so that it passes underneath the pre-driver IC 5V, it becomes possible to lay out the wiring to the upper arm implementation region 227WP for the W phase in a comparatively short distance while still ensuring good insulation performance from the upper and lower arms of the V phase that is a different phase, and it is possible to contemplate enhancement of the freedom for laying out the power supply wiring. Even further, it would also be acceptable to arrange to provide a configuration in which the signal wiring or the low voltage pattern is passed underneath a pre-driver IC, instead of the power supply wiring as shown in FIGS. 15 and 16.

(4) Furthermore, as shown in FIG. 15, it would also be acceptable to dispose the power supply wiring 223W underneath the photo-coupler 221W. By doing this, the layout of the power supply wiring 222W becomes simple and easy.

It would also be possible to combine one or more of the above embodiments and variant embodiments. And any type of combination of the variant embodiments may be adopted.

The above explanation is only given by way of example; the present invention should not be considered as being limited in any way by the structure of the embodiments disclosed above. For example, with a structure in which the signal wiring passes through a lower layer below the lower arm, it would also be possible to employ a prior art type structure in which driver ICs are provided for each of the upper and lower arms. By doing this, it becomes possible to arrange the photo-couplers in regions with the upper and lower control terminals on both sides thereof, so that it is possible to contemplate enhancement of the freedom for layout, and making the drive circuit board more compact. Furthermore while, in the embodiment described above, a case was explained in which the inverter device 140 and the inverter circuit of the power module 300 was a three phase type output, the present invention is not limited to the three phase case.

The content of the disclosure of the following base application, upon which priority is claimed, is hereby incorporated herein by reference:
Japanese Patent Application 253,660 of 2008 (applied on 30 Sep. 2008).

The invention claimed is:

1. A power conversion device, comprising:
a power module comprising an inverter circuit that comprises, for each phase, an upper arm switching element and a lower arm switching element; and
a drive circuit board upon which are implemented, for each phase, an upper arm driver circuit that outputs a drive signal to the upper arm switching element and a lower arm driver circuit that outputs a drive signal to the lower arm switching element;
wherein:
the drive circuit board is made as a laminated board in which a plurality of conductor layers and a plurality of insulating layers are alternately laminated together, and comprises a first board edge portion to which control terminals for the upper arm switching elements are connected, a second board edge portion to which control terminals for the lower arm switching elements are connected, and a board region located between the first and second board edge portions;
in the board region, along with an upper arm implementation region upon which the upper arm driver circuits are implemented and a lower arm implementation region upon which the lower arm driver circuits are implemented being formed for each phase, a low voltage system region is formed upon which are implemented signal transmission elements that transmit control signals to each of the driver circuits while electrically insulating the control signals; and
signal wiring that transmits control signals from the signal transmission elements to the corresponding driver circuits is formed so as to pass under the lower arm driver circuits in a lower conductor layer than the conductor layer at which the lower arm driver circuits are implemented.

2. A power conversion device, comprising:
a power module comprising an inverter circuit that comprises, for each phase, an upper arm switching element and a lower arm switching element; and
a drive circuit board upon which are implemented, for each phase, an upper arm driver circuit that outputs a drive signal to the upper arm switching element and a lower arm driver circuit that outputs a drive signal to the lower arm switching element;
wherein:
the drive circuit board is made as a laminated board in which a plurality of conductor layers and a plurality of insulating layers are alternately laminated together, and comprises a first board edge portion to which control terminals for the upper arm switching elements are connected, a second board edge portion to which control terminals for the lower arm switching elements are connected, and a board region located between the first and second board edge portions;
in the board region, along with an upper arm implementation region upon which the upper arm driver circuits are implemented and a lower arm implementation region upon which the lower arm driver circuits are implemented being formed for each phase, a low voltage system region is formed upon which are implemented signal transmission elements that transmit control signals to each of the driver circuits while electrically insulating the control signals; and
a power supply circuit transformer that supplies source voltage to the upper arm driver circuits and the lower arm driver circuits is implemented in the board region, so as to overlap at least part of at least one of the upper arm implementation region and the lower arm implementation region.

3. A power conversion device according to claim 1, further comprising half bridge type pre-driver elements that are connected to the upper arm driver circuits and the lower arm driver circuits, and that comprise level shift circuits that convert control signals inputted to the lower arm driver circuits to upper arm signals.

4. A power conversion device, comprising:
- a power module comprising an inverter circuit that comprises, for each phase, an upper arm switching element and a lower arm switching element;
- a drive circuit board upon which are implemented, for each phase, an upper arm driver circuit that outputs a drive signal to the upper arm switching element and a lower arm driver circuit that outputs a drive signal to the lower arm switching element; and
- half bridge type pre-driver elements that are connected to the upper arm driver circuits and the lower arm driver circuits, and that comprise level shift circuits that convert control signals inputted to the lower arm driver circuits to upper arm signals;

wherein:
- the drive circuit board is made as a laminated board in which a plurality of conductor layers and a plurality of insulating layers are alternately laminated together, and comprises a first board edge portion to which control terminals for the upper arm switching elements are connected, a second board edge portion to which control terminals for the lower arm switching elements are connected, and a board region located between the first and second board edge portions;
- in the board region, along with an upper arm implementation region upon which the upper arm driver circuits are implemented and a lower arm implementation region upon which the lower arm driver circuits are implemented being formed for each phase, a low voltage system region is formed upon which are implemented signal transmission elements that transmit control signals to each of the driver circuits while electrically insulating the control signals; and
- power supply wiring for supplying power source voltage to a driver circuit is formed in a conductor layer, and moreover is formed so as to pass through the laminated board underneath a pre-driver element.

5. A power conversion device according to claim 4, wherein the power supply wiring for supplying power source voltage to a lower arm driver circuit is formed in a conductor layer that is lower than the conductor layer upon which the lower arm driver circuit is implemented.

6. A power conversion device, comprising:
- a power module comprising an inverter circuit that comprises, for each phase, an upper arm switching element and a lower arm switching element;
- a drive circuit board upon which are implemented, for each phase, an upper arm driver circuit that outputs a drive signal to the upper arm switching element and a lower arm driver circuit that outputs a drive signal to the lower arm switching element; and
- half bridge type pre-driver elements that are connected to the upper arm driver circuits and the lower arm driver circuits, and that comprise level shift circuits that convert control signals inputted to the lower arm driver circuits to upper arm signals;

wherein:
- the drive circuit board is made as a laminated board in which a plurality of conductor layers and a plurality of insulating layers are alternately laminated together, and comprises a first board edge portion to which control terminals for the upper arm switching elements are connected, a second board edge portion to which control terminals for the lower arm switching elements are connected, and a board region located between the first and second board edge portions;
- in the board region, along with an upper arm implementation region upon which the upper arm driver circuits are implemented and a lower arm implementation region upon which the lower arm driver circuits are implemented being formed for each phase, a low voltage system region is formed upon which are implemented signal transmission elements that transmit control signals to each of the driver circuits while electrically insulating the control signals; and
- signal wiring that transmits a control signal from a signal transmission element to its corresponding driver circuit is formed in a conductor layer, and moreover is formed so as to pass through the laminated board underneath a pre-driver element.

7. A power conversion device, comprising:
- a power module comprising an inverter circuit that comprises, for each phase, an upper arm switching element and a lower arm switching element;
- a drive circuit board upon which are implemented, for each phase, an upper arm driver circuit that outputs a drive signal to the upper arm switching element and a lower arm driver circuit that outputs a drive signal to the lower arm switching element; and
- half bridge type pre-driver elements that are connected to the upper arm driver circuits and the lower arm driver circuits, and that comprise level shift circuits that convert control signals inputted to the lower arm driver circuits to upper arm signals;

wherein:
- the drive circuit board is made as a laminated board in which a plurality of conductor layers and a plurality of insulating layers are alternately laminated together, and comprises a first board edge portion to which control terminals for the upper arm switching elements are connected, a second board edge portion to which control terminals for the lower arm switching elements are connected, and a board region located between the first and second board edge portions;
- in the board region, along with an upper arm implementation region upon which the upper arm driver circuits are implemented and a lower arm implementation region upon which the lower arm driver circuits are implemented being formed for each phase, a low voltage system region is formed upon which are implemented signal transmission elements that transmit control signals to each of the driver circuits while electrically insulating the control signals; and
- power supply wiring for supplying power source voltage to a driver circuit is formed in a conductor layer, and moreover is formed so as to pass through the laminated board underneath a signal transmission element.

* * * * *